(12) United States Patent
Martinis et al.

(10) Patent No.: US 11,763,186 B2
(45) Date of Patent: Sep. 19, 2023

(54) REDUCING PARASITIC INTERACTIONS IN A QUBIT GRID FOR SURFACE CODE ERROR CORRECTION

(71) Applicant: Google LLC, Mountain View, CA (US)

(72) Inventors: John Martinis, Santa Barbara, CA (US); Rami Barends, San Diego, CA (US); Austin Greig Fowler, Reseda, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/095,803

(22) Filed: Jan. 11, 2023

(65) Prior Publication Data
US 2023/0169380 A1 Jun. 1, 2023

Related U.S. Application Data

(63) Continuation of application No. 16/636,522, filed as application No. PCT/US2017/046069 on Aug. 9, 2017, now Pat. No. 11,562,280.

(51) Int. Cl.
G06N 10/00 (2022.01)
H03K 19/177 (2020.01)

(52) U.S. Cl.
CPC ........... *G06N 10/00* (2019.01); *H03K 19/177* (2013.01)

(58) Field of Classification Search
CPC .................................................... G06N 10/00
(Continued)

(56) References Cited

U.S. PATENT DOCUMENTS 6,897,468 B2 5/2005 Blais
8,111,083 B1 2/2012 Pesetski et al.
(Continued)

FOREIGN PATENT DOCUMENTS

CN 102439896 5/2012
EP 2014503880 2/2014
(Continued)

OTHER PUBLICATIONS

AU Notice of Acceptance in Australian Appln. No. 2017426936, dated Oct. 28, 2020, 3 pages.
(Continued)

*Primary Examiner* — Tomi Skibinski
(74) *Attorney, Agent, or Firm* — Fish & Richardson P.C.

(57) ABSTRACT

Methods and systems for performing a surface code error detection cycle. In one aspect, a method includes initializing and applying Hadamard gates to multiple measurement qubits; performing entangling operations on a first set of paired qubits, wherein each pair comprises a measurement qubit coupled to a neighboring data qubit in a first direction; performing entangling operations on a second set of paired qubits, wherein each pair comprises a measurement qubit coupled to a neighboring data qubit in a second or third direction, the second and third direction being perpendicular to the first direction, the second direction being opposite to the third direction; performing entangling operations on a third set of paired qubits, wherein each pair comprises a measurement qubit coupled to a neighboring data qubit in a fourth direction, the fourth direction being opposite to the first direction; applying Hadamard gates to the measurement qubits; and measuring the measurement qubits.

17 Claims, 12 Drawing Sheets

(58) Field of Classification Search
USPC .......................................................... 706/62
See application file for complete search history.

(56) References Cited

U.S. PATENT DOCUMENTS

| | | | |
|---|---|---|---|
| 10,050,630 | B2 | 8/2018 | Reagor |
| 10,217,057 | B2 | 2/2019 | Barends |
| 10,693,566 | B2 | 6/2020 | Sliwa |
| 10,915,773 | B2 | 2/2021 | Chang et al. |
| 10,996,959 | B2 | 5/2021 | Morad et al. |
| 2014/0264283 | A1 | 9/2014 | Gambetta et al. |
| 2016/0112066 | A1* | 4/2016 | Ashikhmin ......... H03M 13/154 714/785 |
| 2016/0125311 | A1 | 5/2016 | Fuechsle et al. |
| 2017/0193388 | A1 | 7/2017 | Flipp et al. |
| 2018/0032894 | A1 | 2/2018 | Epstein |
| 2018/0218280 | A1 | 8/2018 | Harris et al. |
| 2019/0303788 | A1 | 10/2019 | Kelly |
| 2020/0258000 | A1 | 8/2020 | Martinis et al. |

FOREIGN PATENT DOCUMENTS

| | | |
|---|---|---|
| EP | 3016034 | 5/2016 |
| EP | 3300004 | 3/2018 |
| WO | WO 2017078734 | 5/2017 |

OTHER PUBLICATIONS

AU Notice of Acceptance in Australian Appln. No. 2017426937, dated Jan. 4, 2021, 3 pages.
AU Office Action in Australian Appln. No. 2017426936, dated Aug. 18, 2020, 4 pages.
AU Office Action in Australian Appln. No. 2017426937, dated Sep. 22, 2020, 3 pages.
AU Office Action in Australian Appln. No. 2017426939, dated Aug. 11, 2020, 4 pages.
Barends et al., "Coherent Josephson Qubit Suitable for Scalable Quantum Integrated Circuits," Physical Review Letters, Aug. 2013, 9 pages.
Barends et al., "Superconducting quantum circuits at the surface code threshold for fault tolerance," Nature, Apr. 2014, 508:500-503.
Fowler et al., "Surface codes: Towards practical large-scale quantum computation," Physical Review A (Atomic, Molecular, and Optical Physics), Oct. 2012, 86(3):1-54.
Garcia et al., "Equivalent Quantum Circuits" CoRR, Oct. 2011, arxiv.org/abs/1110.2998, 12 pages.
Ghosh et al., "A Leakage-Resilient Scheme for the Measurement of Stabilizer Operators in Superconducting Quantum Circuits," CoRR, Jun. 2014, arxiv.org/abs/1406.2404v1, 5 pages.
Ghosh et al., "Leakage-resilient approach to fault-tolerant quantum computing with superconducting elements," Physical Review A (Atomic, Molecular, and Optical Physics), Feb. 2015, 91(2):5pages.
Ghosh et al., "Understanding the effects of leakage in superconducting quantum-error-detection circuits," Physical Review A (Atomic, Molecular, and Optical Physics), Dec. 2013, 88(6):1-7.
Helmer et al., "Cavity grid for scalable quantum computation with superconducting circuits," Europhysics Letters: A Letters Journal Exploring the Frontiers of Physics, Mar. 2009, 85(5):5 pages.
JP Office Action in Japanese Appln. No. 2020-506893, dated Mar. 29, 2021, 8 pages (with English translation).
JP Office Action in Japanese Appln. No. 2020-506894, dated May 17, 2021, 5 pages (with English translation).
JP Office Action in Japanese Appln. No. 2020-506935, dated May 17, 2021, 5 pages (with English translation).
Kelly et al., "Scalable in-situ qubit calibration during repetitive error detection," https://arxiv.org/abs/1603.03082, Mar. 2016, 8 pages.
Kelly et al., "State preservation by repetitive error detection in a superconducting quantum circuit," https://arxiv.org/abs/1411.7403, Nov. 2014, 30 pages.
Martinis et al., "Fast adiabatic qubit gates using only [sigma]z control," Physical Review A (Atomic, Molecular, and Optical Physics), Aug. 2014, 90(2):1-9.
O'Malley et al., "Qubit Metrology of Ultralow Phase Noise Using Randomized Benchmarking," Physical Review Applied, Apr. 2015, 3:1-11.
Office Action in Australian Appln. No. 2021218016, dated Jul. 8, 2022, 3 pages.
Office Action in Canadian Appln. No. 3,072,403, dated May 25, 2021, 5 pages.
Office Action in Canadian Appln. No. 3,072,424, dated Jun. 3, 2021, 5 pages.
Office Action in Canadian Appln. No. 3,072,426, dated May 28, 2021, 6 pages.
Office Action in European Appln. No. 17754946.6, dated Dec. 2, 2021, 6 pages.
Office Action in European Appln. No. 17754949.0, dated Apr. 19, 2022, 6 pages.
Office Action in Japanese Appln. No. 2020-506893, dated Jul. 19, 2021, 5 pages (with English translation).
PCT International Preliminary Report on Patentability in International Appln. No. PCT/US2017/046069, dated Feb. 20, 2020, 11 pages.
PCT International Preliminary Report on Patentability in International Appln. No. PCT/US2017/046071, dated Nov. 12, 2019, 9 pages.
PCT International Preliminary Report on Patentability in International Appln. No. PCT/US2017/046109, dated Feb. 20, 2020, 13 pages.
PCT International Search Report and Written Opinion in International Appln. No. PCT/US2017/046069, dated Apr. 4, 2018, 19 pages.
PCT International Search Report and Written Opinion in International Appln. No. PCT/US2017/046071, dated Apr. 11, 2018, 18 pages.
PCT International Search Report and Written Opinion in International Appln. No. PCT/US2017/046109, dated Apr. 16, 2018, 19 pages.
PCT Written Opinion in International Appln. No. PCT/US2017/046071, dated Jul. 19, 2019, 11 pages.
PCT Written Opinion in International Appln. No. PCT/US2017/046109, dated Jul. 19, 2019, 10 pages.
PCT Written Opinion in International Appln. No. PCT/US2017/046069, dated Jul. 19, 2019, 10 pages.
Suchara et al., "Leakage suppression in the toric code," 2015 IEEE International Symposium Information Theory (ISIT), Jun. 2015, 1119-1123.
Versluis et al., "Scalable quantum circuit and control for a superconducting surface code," https://arxiv.org/abs/1612.08208, Dec. 2016, 9 pages.
Zhou et al., "Quantum Computation with Untunable Coupling," Physical Review Letters, Oct. 2002, 89:197903.
Office Action in Chinese Appln. No. 201780095580.9, dated Mar. 30, 2023, 56 pages (with English translation).
Office Action in Chinese Appln. No. 201780095592.1, dated Apr. 7, 2023, 13 pages (with English translation).
Office Action in Japanese Appln. No. 2021-164059, dated Feb. 6, 2023, 4 pages (with English translation).

* cited by examiner

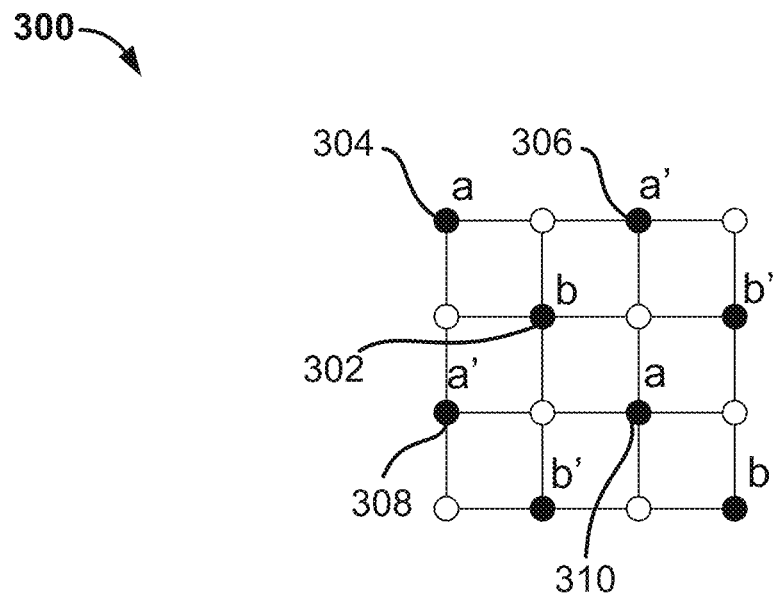
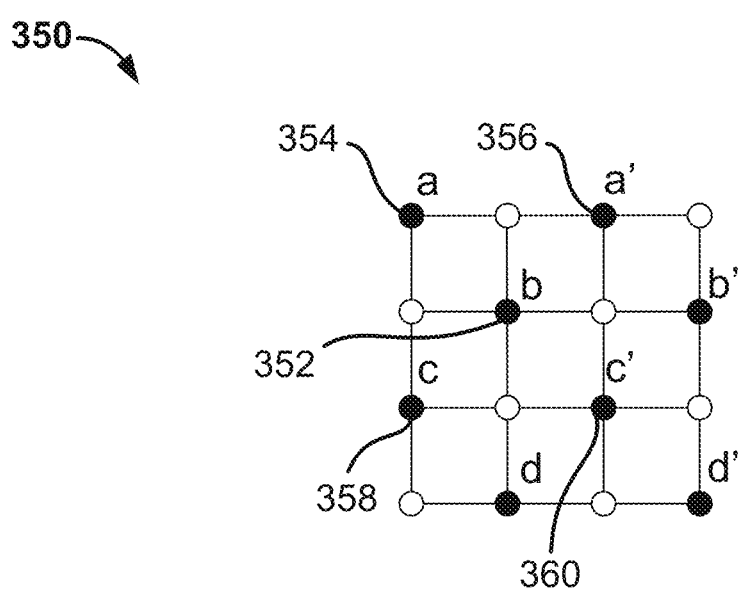
FIG. 3A

500

```
┌─────────────────────────────────────┐
│ Pair multiple data qubits with      │
│ respective neighboring measurement  │
│ qubits                              │
│                                 502 │
└─────────────────────────────────────┘
                   │
                   ▼
┌─────────────────────────────────────┐
│ Perform entangling operation on each│
│ paired data and measurement qubit in│
│ parallel                            │
│                                 504 │
└─────────────────────────────────────┘
```

FIG. 5

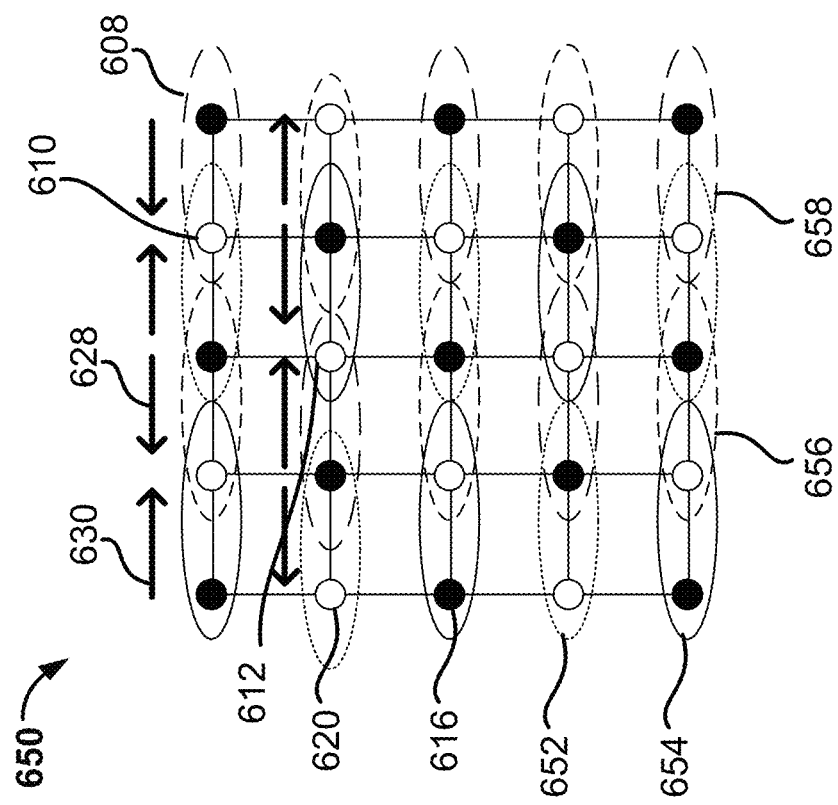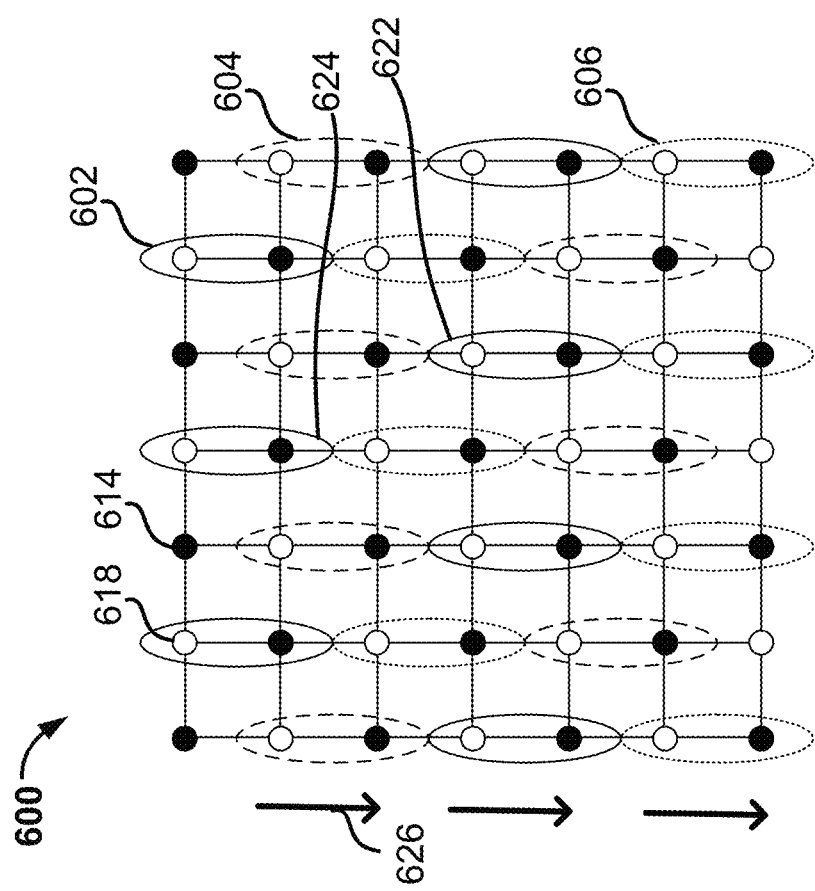
FIG. 6

REDUCING PARASITIC INTERACTIONS IN A QUBIT GRID FOR SURFACE CODE ERROR CORRECTION

CROSS REFERENCE TO RELATED APPLICATIONS

This application is a continuation of U.S. application Ser. No. 16/636,522 filed Feb. 4, 2020, which is a National Stage Application under 35 U.S.C. 371 and claims the benefit of International Application No. PCT/US2017/046069, filed Aug. 9, 2017. The disclosures of the prior applications are considered part of and are incorporated by reference in the disclosure of this application.

BACKGROUND

Large-scale quantum computers have the potential to provide fast solutions to certain classes of difficult problems. For large-scale quantum computing to be realizable, several challenges in the design and implementation of quantum architecture to control and program quantum hardware must be overcome. Reducing the complexity of quantum architecture whilst maintaining a high level of control over the quantum bits included in the quantum architecture is a crucial step in building a scalable quantum computer.

SUMMARY

This specification relates to reducing parasitic interactions between quantum bits. For example, this specification describes systems and methods for performing a surface code error detection cycle.

In general, one innovative aspect of the subject matter described in this specification can be embodied in methods that include the actions of method for performing a surface code error detection cycle, the method comprising: initializing multiple measurement qubits from a system comprising a plurality of data qubits and a plurality of measurement qubits arranged as a two-dimensional grid, wherein each data qubit of the plurality of data qubits within the grid is coupled to neighboring measurement qubits through respective qubit couplers; applying Hadamard quantum logic gates to the initialized measurement qubits; and performing multiple entangling operations on a first set of paired measurement and data qubits, wherein each pair in the first set of paired measurement and data qubits comprises a measurement qubit coupled to a neighboring data qubit in a first direction; performing multiple entangling operations to a second set of paired measurement and data qubits, wherein each pair in the second set of paired measurement and data qubits comprises a measurement qubit coupled to a neighboring data qubit in a second or third direction, the second and third direction being perpendicular to the first direction, the second direction being opposite to the third direction; performing multiple entangling operations to a third set of paired measurement and data qubits, wherein each pair in the third set of paired measurement and data qubits comprises a measurement qubit coupled to a neighboring data qubit in a fourth direction, the fourth direction being opposite to the first direction; applying Hadamard quantum logic gates to the multiple measurement qubits; and measuring the multiple measurement qubits to detect errors.

Other implementations of this aspect include corresponding computer systems, apparatus, and computer programs recorded on one or more computer storage devices, each configured to perform the actions of the methods. A system of one or more computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations the method further comprises applying Hadamard quantum logic gates to data qubits in the second set of paired measurement and data qubits that are paired with measurement qubits in the second direction.

In some implementations the method further comprises applying Hadamard quantum logic gates to data qubits in the second set of paired measurement and data qubits that are paired with measurement qubits in the second direction; and applying Hadamard quantum logic gates to data qubits in the second set of paired measurement and data qubits that are paired with measurement qubits in the third direction.

In some implementations the method further comprises applying Hadamard quantum logic gates to data qubits in the second set of paired measurement and data qubits that are paired with measurement qubits in the third direction.

In some implementations the entangling operations comprise controlled-Z quantum logic gates.

In some implementations performing multiple entangling operations on the first set of paired measurement and data qubits comprises: separating the pairs into multiple subsets of paired qubits, the multiple subsets comprising non overlapping and non-adjacent pairs.

In some implementations the multiple subsets comprise three subsets.

In some implementations performing multiple entangling operations to the first set of paired measurement and data qubits comprises performing entangling operations on pairs of qubits in each of the multiple subsets in parallel.

In some implementations performing entangling operations on pairs of qubits in each of the multiple subsets in parallel comprises detuning each measurement qubit in each subset in parallel.

In some implementations performing multiple entangling operations on the second set of paired measurement and data qubits comprises: separating the pairs into multiple subsets of paired qubits, the multiple subsets comprising overlapping and diagonally adjacent pairs.

In some implementations the multiple subsets comprise four subsets.

In some implementations performing multiple entangling operations on the second set of paired measurement and data qubits comprises performing entangling operations on pairs of qubits in each of the multiple subsets in parallel.

In some implementations performing entangling operations on pairs of qubits in each of the multiple subsets in parallel comprises detuning each measurement qubit in the each subset in parallel.

In some implementations performing multiple entangling operations on the third set of paired measurement and data qubits comprises:separating the pairs into multiple subsets of paired qubits, the multiple subsets comprising non overlapping and non-adjacent pairs.

In some implementations the multiple subsets comprise three subsets.

In some implementations performing multiple entangling operations on the third set of paired measurement and data qubits comprises performing entangling operations on pairs of qubits in each of the multiple subsets in parallel.

In some implementations performing entangling operations on pairs of qubits in each of the multiple subsets in parallel comprises detuning each measurement qubit in the each subset in parallel.

In some implementations the method further comprises performing a leakage removal process on the measurement and data qubits.

In some implementations performing leakage removal comprises swapping measurement and data qubits.

In some implementations swapping measurement and data qubits comprises applying a controlled-Z plus swap quantum gate.

In some implementations the method further comprises performing a subsequent surface code error detection cycle, comprising: initializing the multiple measurement qubits; applying Hadamard quantum logic gates to the initialized measurement qubits; performing entangling operations on the third subset of paired data and measurement qubits in parallel; performing entangling operations on the second subset of paired data and measurement qubits in parallel; performing entangling operations on the first subset of paired data and measurement qubits in parallel; applying Hadamard quantum logic gates to the multiple measurement qubits; and measuring the multiple measurement qubits to detect errors.

In some implementations the plurality of data qubits comprise Xmon qubits.

In some implementations the plurality of measurement qubits comprise Xmon qubits.

The subject matter described in this specification can be implemented in particular embodiments so as to realize one or more of the following advantages.

A quantum computing system implementing methods for reducing parasitic interactions between qubits, as described in this specification, can perform quantum computational operations whilst reducing parasitic interactions between qubits and introducing minimal error. The methods described in this specification can improve the robustness of the quantum computing system and improve the accuracy of computations performed by the quantum computing system.

Methods for reducing parasitic interactions between qubits, as described in this specification, are scalable and allow for lenient, practical requirements on the physical quantum computing hardware needed to implement the methods and perform quantum computations. For example, the methods and systems described in this specification can be implemented using qubit frequency control architecture.

Furthermore, methods for reducing parasitic interactions between qubits, as described in this specification, can increase the efficiency of computations performed by a quantum computing system implementing the methods. For example, the methods enable some quantum logic gates to be implemented simultaneously, thus reducing the time needed to perform an algorithm.

In addition, methods for reducing parasitic interactions between qubits in a quantum computing system, as described in this specification, are strengthened by placing two echo pulses (rotations around the X and/or Y axes that are designed to reduce the susceptibility of qubits to the environment) on idling qubits during an entangling operation on two other qubits, greatly simplifying the algorithmic implementation of quantum computations performed by the quantum computing system. For example, with two echo pulses, a sequence that suppresses noise and has an ideal identity unitary can be constructed. Without the ability to place two echo pulses on idling qubits during an entangling operation on two other qubits, it may be necessary to modify the algorithmic implementation to deal with the unitaries of the echo pulses that commute through the entangling gates representing the entangling operation. The systems and methods described in this specification avoid this modification.

Furthermore, methods for reducing parasitic interactions between qubits, as described in this specification, are lenient with respect to required qubit detunings and thresholds for parasitic coupling strength. The practicality and applicability of the methods described in this specification are therefore far reaching.

One approach to building and operating a quantum computing device is based on surface codes that are operated as stabilizer codes. Surface codes provide a practical method of identifying and handling errors in a two dimensional array of qubits. However, standard implementations of surface codes, e.g., implementations different to that described in this specification, require a dense pattern of nearest neighbor entangling operations. Such dense patterns can cause parasitic couplings between qubits that are diagonally opposed to each other, as described herein.

A quantum computing system implementing methods for reducing parasitic interactions between qubits, as described in this specification, performs surface code cycles using a particular configuration of paired qubits. The configuration enables the surface code to be reliably implemented using a closely spaced, dense two dimensional grid of qubits. In addition, the configuration enables the surface code to be implemented using fewer layers of entangling operations compared to other surface code implementations.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIG. 3A shows example schematic data qubit frequency patterns.

FIG. 5 is a flow diagram of an example process for performing entangling operations on a two dimensional array of qubits.

FIG. 6 shows example pairings of data and measurement qubits for performing entangling operations on a two dimensional array of qubits.

Like reference numbers and designations in the various drawings indicate like elements.

DETAILED DESCRIPTION

Qubits in a quantum computing system can be arranged and operated in a two dimensional grid using nearest neighbor interactions. However, in such a grid, couplings between qubits that are diagonally opposed to each other are relatively large due to their adjacency. Such couplings are parasitic—unintended and uncontrolled. For example, if two diagonal qubits form a parasitic coupling, the qubits may effect each other in an unintended and uncontrolled manner, e.g., by causing unwanted transitions in one or both of the qubits. Unwanted transitions in a qubit can cause the state of the qubit to flip, e.g., from one computational state to another, or cause transitions to higher qubit levels outside the computational subspace. Such transitions can introduce errors into computations performed by the qubits. Minimizing parasitic couplings between qubits when operating a quantum computer, particularly at scale, is therefore an important task in quantum computing.

Example Operating Environment

Figure 1:
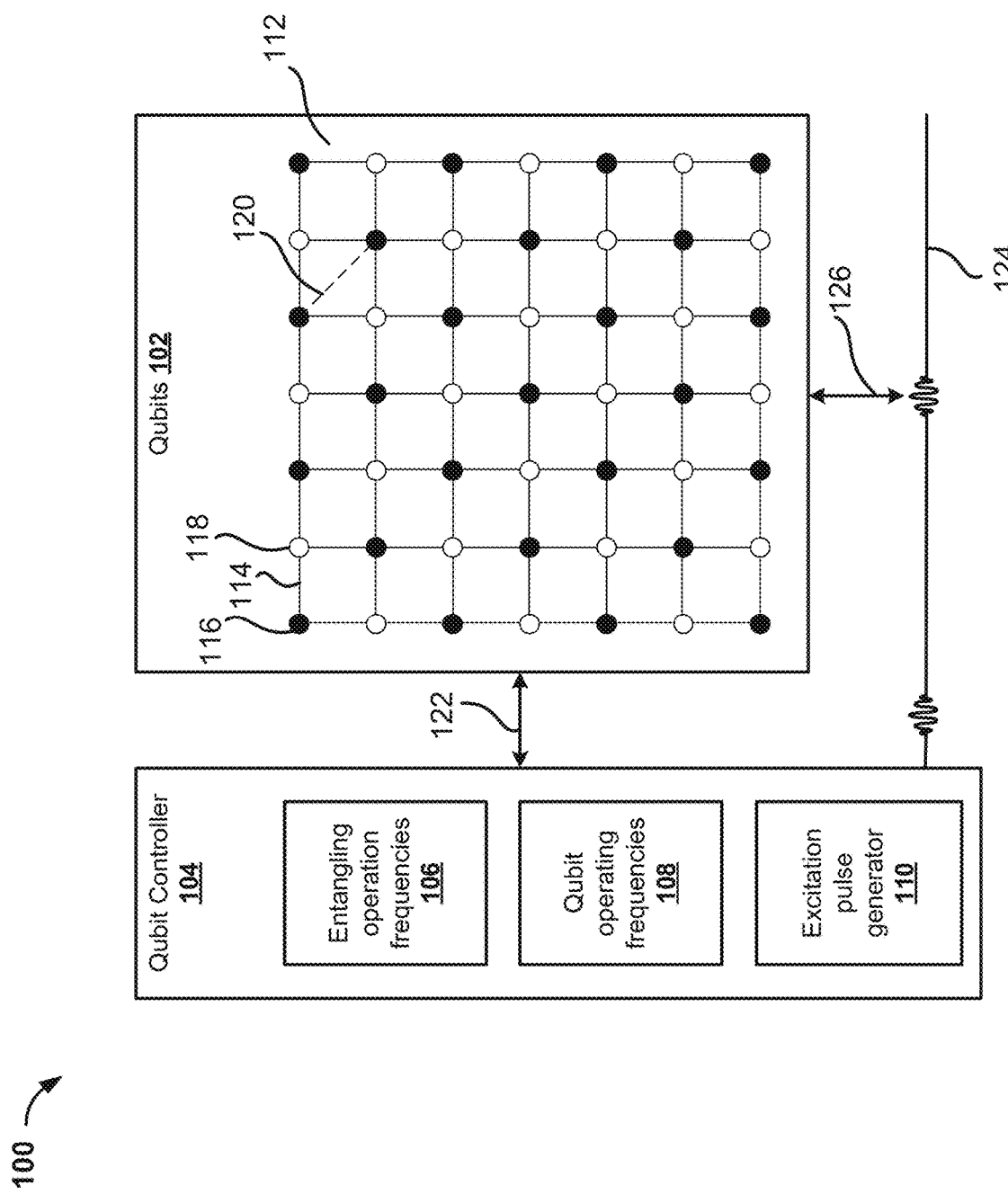
FIG. 1 is a block diagram of an example quantum computing system.

FIG. 1 is a block diagram of an example quantum computing system 100. The example quantum computing system 100 includes multiple qubits 102 (represented as open and filled-in circles) and a qubit controller module 104. The example quantum computing system 100 is an example of a system that may be used to perform quantum algorithmic operations, simulations or computations.

The multiple qubits 102 are arranged as a two dimensional grid 112. For clarity, the two dimensional grid 112 depicted in FIG. 1 includes 7×7 qubits, however in some implementations the system 100 may include a smaller or a larger number of qubits. The multiple qubits 102 interact with each other through multiple qubit couplers, e.g., qubit coupler 114. The multiple qubit couplers define nearest neighbor interactions between the multiple qubits 102. In some implementations, the strengths g of the multiple qubit couplers are tunable parameters. In some cases, the multiple qubit couplers included in the quantum computing system 100 may be couplers with a fixed coupling strength.

In some implementations the multiple qubits 102 may include data qubits, e.g., the open circles such as qubit 118, and measurement qubits, e.g., the filled in circles, such as qubit 116. A data qubit is a qubit that participates in a computation being performed by the system 100. A measurement qubit is a qubit that may be used to determine an outcome of a computation performed by the data qubit. That is, during a computation an unknown state of the data qubit is transferred to the measurement qubit using a suitable physical operation and measured via a suitable measurement operation performed on the measurement qubit.

The multiple data qubits are each configured to operate at qubit frequencies from a respective frequency region. For example, each data qubit may be configured to operate at a respective data qubit frequency from one of multiple data qubit frequency regions. Similarly, each measurement qubit may be configured to operate at a respective measurement qubit frequency from one of multiple measurement qubit frequency regions.

The qubit frequency regions may include computational qubit frequency regions. For example, each data or measurement qubit may be configured to operate at a qubit frequency from a respective computational qubit frequency region, e.g., when the qubit is involved in a computation or algorithmic operation. A qubit may be said to operate at a qubit frequency from a computational qubit frequency region if transitions between qubit computational basis states occur at the qubit frequency.

The qubit frequency regions may include idling qubit frequency regions. For example, each data or measurement qubit may be configured to operate at a qubit frequency from a respective idling qubit frequency region, e.g., when the qubit is idling and not involved in an interaction or computational operation. A qubit may be said to operate at a qubit frequency from an idling qubit frequency region for a set duration of time if an intended unitary for the qubit is unity $\mathbb{I}$ for the duration of time. The qubit is therefore not engaging in entangling quantum logic gate operations—only echo pulses with unity unitary are applied to the qubit, where an echo pulse is defined a rotation around the X and/or Y axis that is designed to reduce the susceptibility of qubits to the environment. In other words, the qubit may be said to be resting at a frequency from the idling qubit frequency region that minimizes interactions between the qubit and other qubits, whilst other qubits perform interactions or undergo unitary operations.

The qubit frequency regions may include interaction qubit frequency regions. For example, a data and measurement qubit may be configured to operate at respective qubit frequencies from a respective interaction frequency region, e.g., when the data and measurement qubit interact.

The qubit frequency regions may include a readout and reset frequency region. For example, a measurement qubit may be configured to operate at a qubit frequency from a respective readout and reset frequency region, e.g., when a measurement operation is being performed on the measurement qubit. A qubit may be said to operate at a qubit frequency from a readout and reset qubit frequency region if the qubit frequency is near or in alignment with the operating frequency of a readout resonator or other measurement device to bring about a measurement or reset operation.

The data qubits and measurement qubits are arranged such that the qubit couplers define nearest neighbor interactions between data qubits and measurement qubits. That is, each data qubit is coupled to multiple measurement qubits, and each measurement qubit is coupled to multiple data qubits.

In other implementations, the multiple qubits 102 may not be separated into multiple data qubits and multiple measurement qubits. For example, in cases where the system 100 includes a quantum computer that is not implementing the surface code, e.g., a quantum computer that is used to perform one or more quantum algorithms such as supremacy algorithms, the system may not need to distinguish between data and measurement qubits. In these examples, the disclosed systems and methods can be used to reduce the number of layers of quantum logic gates required to perform the quantum algorithms, therefore speeding up the algorithm and reducing the error of the algorithm.

In cases where there is no distinction between data qubits and measurement qubits, the same processes described herein can be used. For example, the qubits may be configured to operate at qubit frequencies within respective frequency regions. Some qubits may be configured to operate at respective qubit frequencies within one of multiple different first qubit frequency regions. Other qubits may be configured to operate at respective qubit frequencies within one of multiple different second qubit frequency regions. The qubit frequency regions in the multiple first and second qubit frequency regions may include respective computational frequency regions, idling frequency regions, interaction frequency regions and readout/reset frequency regions.

As described herein, the example two dimensional grid 112 may include parasitic couplings between qubits that are diagonally opposed to each other, e.g., parasitic coupling 120. In some cases, parasitic couplings between qubits include a nonzero parasitic coupling strength $g_{diag}$. For example, in some cases the parasitic coupling strength may take values of up to $g_{diag}/\pi \sim 5$ MHz.

The multiple qubits 102 in two dimensional grid 112 are operated via the qubit controller module 104. The qubit controller module 104 may operate the qubits 102 by controlling the frequencies of the qubits 102, e.g., according to qubit operating frequencies 108. The qubit operating frequencies are dependent on the type of qubits included in the system 100 and on the operations being performed by the system. Example qubit operating frequency patterns for reducing parasitic interactions between diagonal qubits are described in detail below with reference to FIGS. 2 to 4.

For example, the qubit controller module 104 may control individual frequencies of the qubits 102 such that the frequency of one or more of the qubits are adjusted towards or away from a frequency, e.g., an entangling operation frequency 106, of an excitation pulse generated by an excitation pulse generator 110 on an excitation driveline 124. Excitation pulses generated by the excitation pulse generator 110 may include pulses whose frequencies implement quantum operations, e.g., quantum logic gates. For example, the excitation pulse generator 110 may be configured to generate excitation pulses whose frequencies cause one or more qubits to perform entangling operations, e.g., controlled-Z gates. Performing entangling operations on a two dimensional grid of qubits is described in more detail below with reference to FIGS. 2 to 5.

The multiple qubits may be coupled to the excitation driveline via respective couplers, e.g., coupler 126. In some cases the couplers may be capacitive couplers, e.g., realized by a microwave line running adjacent to a qubit capacitor. For convenience, a global excitation driveline is illustrated in FIG. 1. However, in some implementations the system 100 may include multiple excitation drivelines, e.g., corresponding to multiple qubits.

The qubit controller module 104 may be configured to tune the frequencies of the qubits 102 through one or more qubit frequency control lines, e.g., qubit frequency control line 122. For convenience, one qubit frequency control line is shown in FIG. 1. However, in some implementations the system 100 may include multiple qubit frequency control lines, e.g., corresponding to each of the multiple qubits 102. The qubit frequency control lines may be supplied by in-plane wiring or out-plane wiring.

The type of qubit controller 112 that the system 100 utilizes is dependent on the type of qubits the system uses. As an example, qubits that are realized via atomic, molecular or solid-state quantum systems typically have energy separation of the relevant qubit levels in the microwave or optical domain. The states of such qubits may be manipulated and controlled using external fields, such as microwave or optical fields. In such cases, as an example, mode-locked lasers may serve as qubit controllers due to their broad-band optical spectra that feature both radio frequency and microwave structure. In another example, the qubit controller could include a collection of individual qubit controllers realized by a radio frequency generator as well as one or a collection of global excitation controllers realized by a radio frequency or microwave generator. In both cases, the qubit controller may be operated manually or connected to a computer and controlled via suitable software allowing for specifying and automatically running the required qubit operations.

Figure 2:
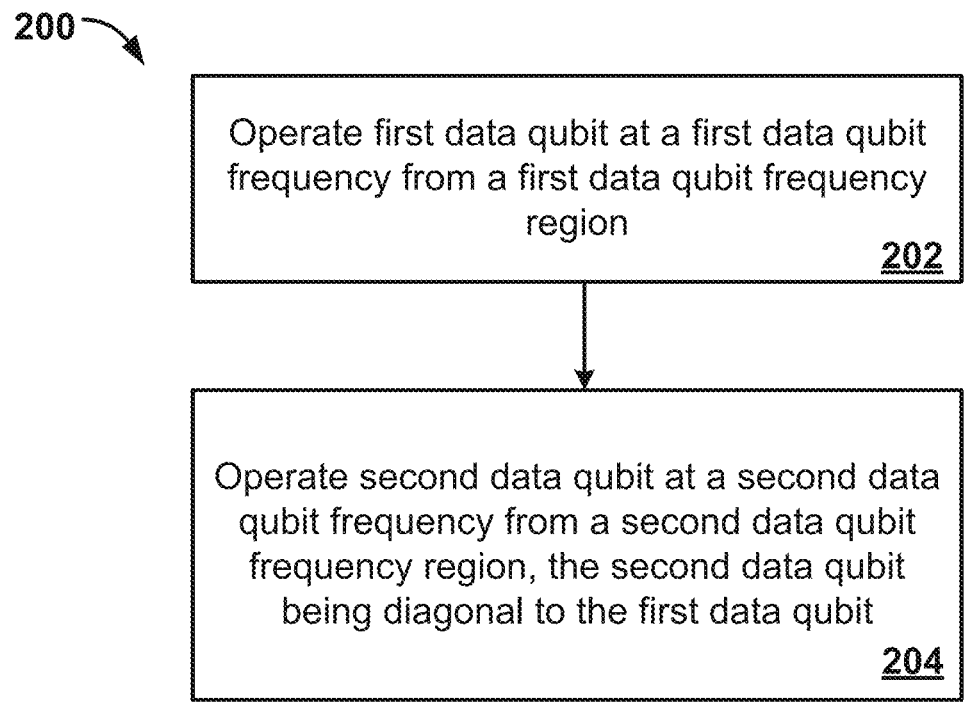
FIG. 2 is a flow diagram of an example process for operating a system of qubits.

Programming the Hardware: Quantum Bit Frequency Patterns for Decreasing Parasitic Interactions For convenience, the disclosure provided below with reference to FIGS. 2 to 4 is described with reference to a system of multiple qubits that include multiple data qubits and multiple measurement qubits that interact via qubit couplers defining nearest neighbor interactions between data and measurement qubits. However, this is one example of a system of qubits that may be programmed and operated using the techniques described herein. For example, in some implementations the following techniques may be used to program and operate a system of qubits that do not distinguish between data or measurement qubits. For example, in cases where the system of qubits is used to perform quantum algorithms, e.g., supremacy algorithms, the qubits may be indistinguishable. In settings where it is not required to distinguish between data and measurement qubits, the following arrangements and processes may still be used.

FIG. 2 is a flow diagram of an example process 200 for operating a system of qubits. For convenience, the process 200 will be described as being performed by a system of one or more quantum or classical computers located in one or more locations. For example, the process 200 can be implemented using the qubit controller 104 of system 100 described above with reference to FIG. 1.

The system of qubits includes qubits that interact via qubit couplers defining nearest neighbor interactions. In some implementations the system of qubits may include multiple data qubits and multiple measurement qubits that interact via qubit couplers defining nearest neighbor interactions between data and measurement qubits. The system of qubits is arranged as a two dimensional grid and each data qubit of the multiple data qubits is coupled to multiple measurement qubits through multiple qubit couplers. Each data qubit is configured to operate at a data qubit frequency from one of multiple data qubit frequency regions. Each measurement qubit is configured to operate at a measurement qubit frequency from one of multiple measurement qubit frequency regions. Example data qubit frequency regions and measurement qubit frequency regions are described below with reference to steps 202 and 204. An example system of qubits is illustrated with reference to FIG. 1.

The system operates a first data qubit from the multiple data qubits at a first data qubit frequency from a first data qubit frequency region (step 202). For example, as illustrated in schematic data qubit frequency pattern 300 described below with reference to FIG. 3A, data qubit 302 may be operated at a data qubit frequency b from a respective data qubit frequency region B.

The system operates a second data qubit from the multiple data qubits at a second data qubit frequency from a second data qubit frequency region (step 204). The second data qubit is a data qubit that is diagonal to the first data qubit in the two-dimensional grid. For example, as illustrated in schematic data qubit frequency pattern 300 described below with reference to FIG. 3A, the system may operate a second qubit, e.g., qubit 304, at a data qubit frequency a from a respective data qubit frequency region A.

The second data qubit frequency and the second data qubit frequency region is different to the first data qubit frequency and the first data qubit frequency region, respectively. For example, as illustrated in schematic data qubit frequency pattern 300 described below with reference to FIG. 3A, first data qubit 302 may be operated at a data qubit frequency b from a respective data qubit frequency region B, and second data qubit 304 that is diagonal to data qubit 302, may be operated at data qubit frequency a from a different data qubit frequency region A.

In some implementations the system may further operate third data qubit from the multiple data qubits at the second data qubit frequency. The third data qubit is different to the second data qubit and is diagonal to the first data qubit in the two-dimensional. For example, as illustrated in schematic data qubit frequency pattern 300 described below with reference to FIG. 3A, the system may operate a first data qubit 302 at a data qubit frequency b from a respective data qubit frequency region B, a second data qubit 304 that is diagonal to data qubit 302 at data qubit frequency a from a different data qubit frequency region A, and a third data qubit 306 that is different to second data qubit 304 and is diagonal to the first data qubit 302.

In some implementations the system may further operate a fourth data qubit and a fifth data qubit from the multiple data qubits at a respective fourth data qubit frequency from a third data qubit frequency region and fifth data qubit frequency region from a third data qubit frequency region. The third data qubit frequency region is different to the first data qubit frequency region. The fourth and fifth data qubits are diagonal to the first data qubit.

For example, as illustrated in schematic data qubit frequency pattern 300 described below with reference to FIG. 3A, the system may operate a first data qubit 302 at a data qubit frequency b from a respective data qubit frequency region B, a second data qubit 304 at data qubit frequency a from a data qubit frequency region A, a third data qubit 306 at a data qubit frequency a' from the data qubit frequency region A, a fourth data qubit 310 at a data qubit frequency a from data qubit frequency region A, and a fifth data qubit 308 at a data qubit frequency a' from data qubit frequency region A. In some implementations the third data qubit frequency region may be the same as the second data qubit frequency region. In other implementations the third data qubit frequency region may be different to the second data qubit frequency region, e.g., data qubits 308 and 310 may operate at data qubit frequencies c' and c, respectively.

Figure 3B:
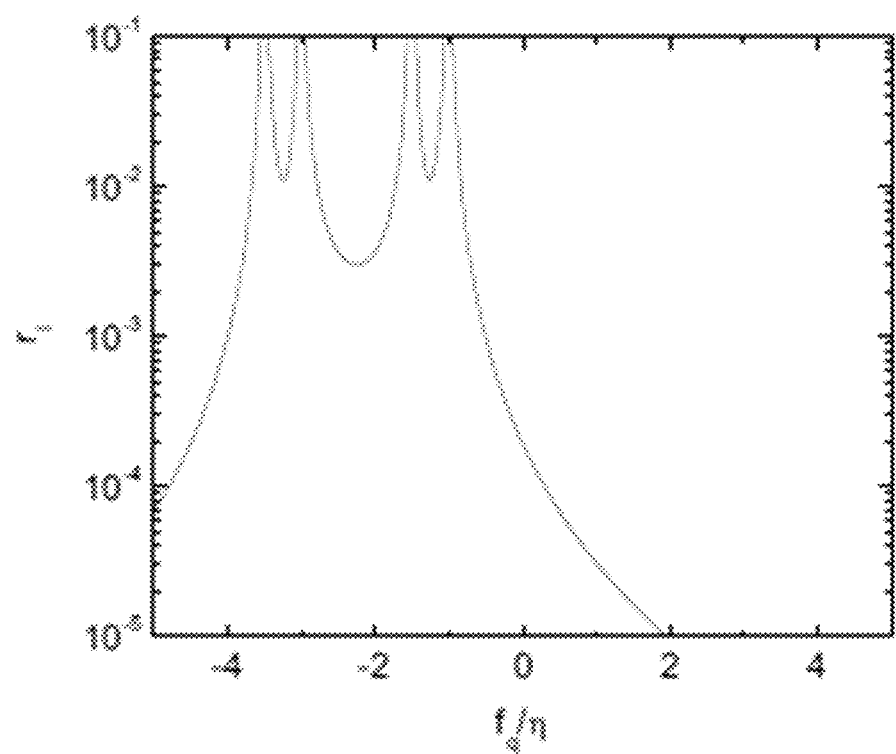
FIG. 3B shows an example plot showing idling error due to parasitic interactions versus qubit frequency divided by system nonlinearity for a single qubit.
Figure 4:
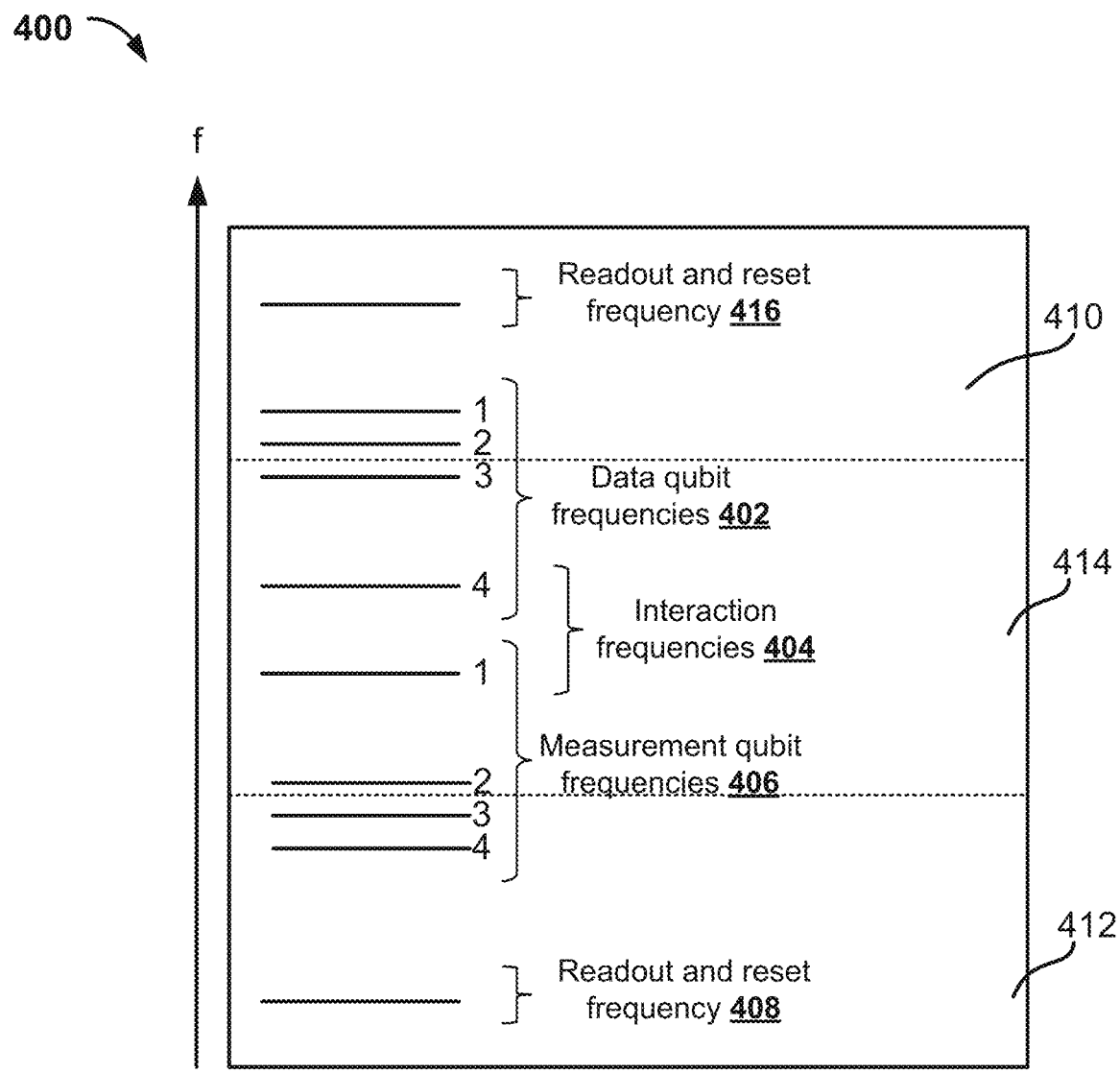
FIG. 4 shows example data qubit and measurement qubit frequencies.

As illustrated in schematic data qubit frequency pattern 300 of FIG. 3A, in some implementations the multiple data qubit frequency regions include two data qubit frequency regions, e.g., a first region A and a second region B. In these implementations, data qubit frequencies from each region may be offset by $-2\eta$, where $\eta$ represents nonlinearity of the system. For example, data qubit frequencies $a \in A$ and $b \in B$ may differ by $2\eta$. One explanation of why the frequency differences depend on the nonlinearity of the system is as follows. An idling qubit may be affected by parasitic interactions from diagonal qubits. To minimize these effects, a frequency difference between diagonal qubits is optimally selected. The influence of diagonal qubits can be expressed by the nonlinearity of the system. Therefore, by analyzing the nonlinearity of the system a range of frequency values that locally minimizes the influence of diagonal qubits can be found. That is, the system nonlinearity provides an indication of how to minimize parasitic interactions between qubits and therefore how to minimize errors in the system. An example plot showing idling ZZ errors (y axis) from frequency shifts due to parasitic interactions from diagonal qubits versus qubit frequency divided by system nonlinearity (x axis) for a single qubit is shown in FIG. 3B.

In addition, in some implementations data qubit frequencies from a particular data qubit frequency region may include frequencies within a predetermined frequency region, e.g., a predetermined frequency region of width 10 MHz. For example, data qubits 304 and 306 of FIG. 3A may operate at data qubit frequencies a and a', respectively, where a and a' differ by approximately 10 MHz.

Furthermore, in some implementations swapping can be avoided by ensuring that the difference between data qubit frequencies within a predetermined frequency region is larger than a next-nearest neighbor coupling constant g. For example, the difference between data qubit frequencies a, a' of qubits 304 and 306 that are diagonal to qubit 302 may be larger than g, e.g., (a−a')≫g. For a next-nearest neighbor coupling constant g=1 MHz, a detuning between a and a' of 10 MHz is acceptable.

As illustrated in schematic data qubit frequency pattern 350 of FIG. 3A, in some implementations the multiple data qubit frequency regions include four data qubit frequency regions, e.g., regions A, B, C and D. Multiple frequency regions enable qubits to be "parked" and individually controlled, e.g., using a global XY excitation driveline. For example, for $\eta$=200 MHz, data qubits may be parked or operated at frequencies between 6 and 7 GHz, e.g., at 6.7 GHz, 6.3 GHz, 6.8 GHz, and 6.2 GHz.

In these implementations, the multiple data qubit frequency regions may include a first idling frequency region. A data qubit may be configured to operate at an idling frequency when the data qubit is not actively involved in an algorithmic computation being performed by the system of qubits and is idling.

The multiple data qubit frequency regions may further include a first echo operation frequency region. A data qubit may be configured to operate at an echo operation frequency when an echo operation is being performed on the data qubit.

The multiple data frequency regions may further include a first single qubit gate frequency region. A data qubit may be configured to operate at a single qubit gate frequency region when a single qubit quantum gate, e.g., a Hadamard quantum logic gate or a Pauli X, Y or Z quantum logic gate, is being performed on the data qubit.

The multiple data frequency regions may further include an interaction frequency region. A data qubit may be configured to operate at an interaction frequency region when the data qubit is interacting with a neighboring measurement qubit, e.g., when entangling operations are performed on a paired data and neighboring measurement qubit. Example data qubit frequency regions are illustrated with reference to FIG. 4.

In implementations where the multiple data qubit frequency regions include four data qubit frequency regions, operating the system of qubits may include, for each data qubit, operating the data qubit at a data qubit frequency from a data qubit frequency region, where each other data qubit that is diagonal to the data qubit is operated at a respective other data qubit frequency from a different data qubit frequency region, and where opposing other data qubits that are diagonal to the data qubit are operated at respective other data qubit frequencies from different data qubit frequency regions.

For example, as illustrated in schematic data qubit frequency pattern 350 of FIG. 3A, data qubit 352 may be operated at a data qubit frequency b from a respective data qubit frequency region B, and each other data qubit that is diagonal to data qubit 352, e.g., data qubits 354, 356, 358 and 360, may be operated at data qubit frequencies a, a', c, or c' from different data qubit frequency regions A and C. Opposing other data qubits that are diagonal to the data qubit 352, e.g., data qubits 356 and 358, or data qubits 354 and 360, operate at respective data qubit frequencies from different data qubit frequency regions. That is, data qubit 356 operates at a frequency from data qubit frequency region A and data qubit 358 operates at a frequency from different data qubit frequency region C. Similarly, data qubit 354 operates at a frequency from data qubit frequency region A and data qubit 360 operates at a frequency from different data qubit frequency region C.

In these implementations, data qubit frequencies corresponding to diagonal data qubits may be offset by $-2\eta$, e.g., $(a-b)/\eta \geq 2$. For example, in the schematic data qubit frequency pattern 350, the data qubit frequencies may be set as $a=0$, $b=-2\eta$, $c=0.5\eta$, $d=-2.5\eta$. In some implementations $\eta=0.2$ GHz, giving frequency ranges of approximately 0.8-1.0 GHz for the frequency domain in which similar qubits—data or measurement qubits—can be parked. For example, if all data qubits are parked at a frequency between 6-7 GHz, e.g. the 0.8-1 GHz range, and all measurement qubits are parked between 4-5 GHz, interactions may occur between 5 and 6 GHz. However, other layouts are also possible.

In addition, in some implementations data qubit frequencies from a particular data qubit frequency region may include frequencies within a predetermined frequency region, e.g., a predetermined frequency region of width 10 MHz. For example, data qubits 354 and 356 of FIG. 3A may operate at data qubit frequencies a and a', respectively, where a and a' differ by approximately 10 MHz.

Furthermore, in some implementations, the difference between other data qubit frequencies that are diagonal to the qubit, e.g., data qubit frequencies a, a' or c, c', may be larger than the nearest neighbor coupling constant g, e.g., $(a-a') \gg g$.

As described herein, e.g., with reference to FIG. 4, the above described data qubit frequency pattern facilitates a dense pattern on entangling operations, e.g., controlled-Z quantum logic gates, to be executed with no nearest neighboring—including diagonal—qubits at a same frequency. Parasitic interactions can therefore be reduced.

The data qubit properties described above can also be applied to the multiple measurement qubits in the system of qubits. For example, operating the system of qubits may further include, for each measurement qubit, operating the measurement qubit at a measurement qubit frequency from a measurement qubit frequency region, where each other measurement qubit that is diagonal to the measurement qubit is operated at a respective other measurement qubit frequency from a different measurement qubit frequency region.

In some implementations the multiple measurement qubit frequency regions include two measurement qubit frequency regions. The measurement qubit frequency and the other measurement qubit frequency may differ by $2\eta$. The other measurement qubit frequencies may include frequencies within a predetermined frequency region, optionally including a predetermined frequency region of width 10 MHz. The difference between other measurement qubit frequencies within a predetermined frequency region may be larger than the nearest neighbor coupling constant g.

In some implementations the multiple measurement qubit frequency regions may include four measurement qubit frequency regions, optionally including a second idling frequency region, a second echo operation frequency region, a second single qubit gate frequency region, and a second interaction frequency region. For example, data qubits may be parked or operated at a frequency between 6 and 7 GHz, measurement qubits may be parked or operated at a frequency between 4 and 5 GHz, and interactions between qubits may occur between 5 and 6 GHz.

In these examples, operating the system of qubits may further include, for each measurement qubit, operating the measurement qubit at a measurement qubit frequency from a measurement qubit frequency region, where each other measurement qubit that is diagonal to the measurement qubit is operated at a respective other measurement qubit frequency from a different measurement qubit frequency region, and where opposing other measurement qubits that are diagonal to the measurement qubit are operated at respective other measurement qubit frequencies from different measurement qubit frequency regions.

In some implementations diagonal measurement qubits may be offset by $2\eta$, optionally wherein $\eta=0.2$ GHz. Other measurement qubit frequencies from a same measurement qubit frequency region may include frequencies within a predetermined frequency region, optionally including a predetermined frequency region of width 10 MHz. The difference between other measurement qubit frequencies from a same measurement qubit frequency region is larger than g.

In some implementations, a readout and reset frequency region that is adjacent to one of the multiple measurement qubit frequency regions may be included. Placing a readout and reset frequency region adjacent to the measurement qubit frequency regions enables the frequencies of the qubits to be tuned close to readout resonators to get a large dispersion and therefore a large measurement signal. In addition, placing the readout and reset frequency region adjacent to the measurement qubit frequency regions enables a reset operation of the measurement qubits with the readout resonators. Furthermore, placing the readout and reset frequency region adjacent to the measurement qubit frequency regions enables movement of the measurement qubits beyond the readout resonators, allowing for movement of the data qubits close to the readout resonators to get large dispersion and a large signal, without having negative effects on the measurement qubits.

FIG. 3A shows example schematic data qubit frequency patterns 300 and 350. Example schematic data qubit frequency pattern 300 shows multiple data qubits, e.g., data qubits 302, 304, 306, 308 and 310, coupled to multiple measurement qubits via nearest neighbor interactions. The example schematic data qubit frequency pattern 300 shows data qubits operated at data qubit frequencies a, a', b, b' from two data qubit frequency regions A and B. Each data qubit in the example schematic data qubit frequency pattern 300 is operated at a data qubit frequency that is different to the data qubit frequencies that diagonally adjacent data qubits operate at. For example, data qubit 302 operates at data qubit frequency b from frequency region B, whilst its diagonally adjacent data qubits 304, 306, 308 and 310 operate at data qubit frequencies a, a', a' and a, respectively, from frequency region A.

Example schematic data qubit frequency pattern 350 shows multiple data qubits, e.g., data qubits 352, 354, 356, 358 and 360, coupled to multiple measurement qubits via nearest neighbor interactions. The example schematic data qubit frequency pattern 350 shows data qubits operated at data qubit frequencies a, a', b, b', c, c' and d, d'. The data qubit frequencies may be frequencies from four respective data qubit frequency regions, e.g., regions A, B, C and D. Each data qubit in the example schematic data qubit frequency pattern 350 is operated at a data qubit frequency that is different to the data qubit frequencies that diagonally adjacent data qubits operate at. In addition, qubits that are diagonally adjacent to a data qubit and diagonally opposed to each other, e.g., qubits 356 and 358, operate at differing data qubit frequencies. For example, data qubit 352 operates at data qubit frequency b from frequency region B, whilst its diagonally adjacent data qubits 354 and 360, since they are diagonally opposed to each other, operate at data qubit frequencies a and c', respectively, from frequency regions A and C. Similarly, its diagonally adjacent data qubits 356 and 358, since they are diagonally opposed to each other, operate at data qubit frequencies a' and c, respectively, from frequency regions A and C.

FIG. 4 shows example data qubit and measurement qubit frequencies 400. The example data qubit and measurement qubit frequencies includes 9 different frequencies ranging over frequency ranges 410, 412 and 414. Four frequencies are data qubit frequencies 402. Four frequencies are measurement qubit frequencies 406. One of the data qubit frequencies is an interaction frequency 404. Similarly, one of the measurement qubit frequencies is an interaction frequency 404. One frequency is a readout and reset frequency 408. This configuration of frequencies enables a dense pattern on entangling operations, e.g., controlled-Z quantum logic gates, to be executed with no neighboring—including diagonal—qubits at a same frequency. Parasitic interactions can therefore be reduced, since the qubits are geometrically well separated.

The data qubit frequencies 1, 2 in the frequency range 410 are idling data qubit frequencies. Similarly, the measurement qubit frequencies 3, 4 in the frequency range 412 are idling measurement qubit frequencies. The data qubit frequencies 3, 4 and measurement qubit frequencies 1, 2 in the frequency range 414 are qubit frequencies for qubits that are being manipulated. In some implementations one or more frequencies in frequency ranges 410 and 412 or in frequency range 414 can also be chosen for globally applied single qubit gates.

The example data qubit and measurement qubit frequencies 400 further includes an additional readout and reset frequency 416 for data qubits. The additional readout and reset frequency 416 is shown as being located at a higher frequency than the data qubit frequencies 402, i.e., above the data qubit frequencies 402 with reference to the illustration 400. The additional readout and reset frequency 416 could enable data qubits to be read out or reset while interacting other pairs of qubits. This could be beneficial in various settings. An example setting includes performing surface code error detection in superconducting hardware since when excessively excited (leaked) states are removed, measurement qubits become data qubits and vice versa. In this setting measuring data qubits whilst interacting with other pairs of qubits could be very beneficial.

Programming the Hardware: Simultaneous Quantum Bit Detuning for Reducing Parasitic Interactions For convenience, the techniques described with reference to FIGS. 5 to 8 relate to a system of multiple qubits that include multiple data qubits and multiple measurement qubits that interact via qubit couplers defining nearest neighbor interactions between data and measurement qubits. However, this is one example of a system of qubits that may be programmed and operated using the following techniques. For example, in some implementations the following techniques may be used to program and operate a system of qubits that do not distinguish between data or measurement qubits. For example, in cases where the system of qubits is used to perform quantum algorithms, e.g., supremacy algorithms, the qubits may be indistinguishable. In settings where it is not required to distinguish between data and measurement qubits, the following techniques and arrangements may still be used.

FIG. 5 is a flow diagram of an example process 500 for performing entangling operations using a system of qubits. For convenience, the process 500 will be described as being performed by a system of one or more quantum or classical computers located in one or more locations. For example, the process 500 can be implemented using the qubit controller module 104 of system 100 described above with reference to FIG. 1. In some implementations, the process 500 may be performed in conjunction with the frequency patterns described above with reference to FIGS. 2 to 4.

The system of qubits includes multiple qubits and multiple qubit couplers defining nearest neighbor interactions between the multiple qubits. In some implementations the multiple qubits may include multiple data qubits, multiple measurement qubits, and multiple qubit couplers defining nearest neighbor interactions between the data qubits and measurement qubits. The system of qubits is arranged as a two dimensional grid and each data qubit of the multiple data qubits is coupled to multiple measurement qubits through respective qubit couplers. An example two dimensional grid is illustrated above with reference to FIG. 1.

The system pairs multiple data qubits with respective neighboring measurement qubits (step 502). In some implementations the system may pair the multiple data qubits and measurement qubits into non-overlapping pairs. For example, each data qubit that is paired with a respective neighboring measurement qubit may not be paired with another neighboring measurement qubit. Similarly, each measurement qubit that is paired with a respective neighboring data qubit may not be paired with another neighboring data qubit. An example pairing of data qubits and neighboring measurement qubits into non-overlapping pairs is illustrated in the example two dimensional qubit grid 600 of FIG. 6.

Alternatively or in addition, the system may pair multiple data qubits and respective neighboring measurement qubits into pairs with parallel qubit couplers. For example, with reference to the two dimensional grid 112 shown above with reference to FIG. 1, the system may pair data qubits with measurement qubits that are directly above or below the data qubits. In this configuration, the paired data and measurement qubits may be described as having north-south parallel couplers.

In cases where the system pairs multiple data qubits with respective neighboring measurement qubits into non-overlapping pairs, the parallel couplers have a same direction. That is, each measurement qubit may be paired with a respective neighboring data qubit to its north (or its south). An example pairing of data qubits and neighboring measurement qubits into non-overlapping pairs with north-south parallel couplers is illustrated in the example two dimensional grid 600 of FIG. 6. In some cases, e.g., those where the system pairs multiple data qubits with respective neighboring measurement qubits into overlapping pairs, the parallel couplers may have different directions. That is, some measurement qubits may be paired with a first data qubit in a northerly direction and a second data qubit in a southerly direction. In the example two dimensional grid 600, the qubits are coupled with couplers in a northerly direction only, as indicated by the arrow 626.

As another example, with reference to the two dimensional grid 112 shown above with reference to FIG. 1, the system may pair data qubits with measurement qubits that are directly to the right or left of the data qubits. In this configuration, the paired data and measurement qubits may be described as having east-west parallel couplers.

In cases where the system pairs multiple data qubits with respective neighboring measurement qubits into non-overlapping pairs, the parallel couplers have a same direction. That is, each measurement qubit may be paired with a respective neighboring data qubit to its west (or its east). In cases where the system pairs multiple data qubits with respective neighboring measurement qubits into overlapping pairs, the parallel couplers may have different directions. That is, some measurement qubits may be paired with a first data qubit in a westerly direction and a second data qubit in an easterly direction. An example pairing of data qubits and neighboring measurement qubits into overlapping pairs with east-west parallel couplers of different directions is shown in the example two dimensional grid 650 of FIG. 6. In the example two dimensional grid 650, the qubits are coupled with couplers in both an easterly and westerly direction, as indicated by the arrows 628 and 630.

In some implementations the system may pair a subset of the multiple data qubits with respective neighboring measurement qubits. For example, the system may pair multiple data qubits with respective neighboring measurement qubits such that each paired data qubit and measurement qubit is nonadjacent to other paired data qubits and measurement qubits. Example nonadjacent pairs of data qubits and respective neighboring measurement qubits are illustrated in the example two dimensional grid 600 of FIG. 6.

In some implementations the system may pair multiple data qubits with respective neighboring measurement qubits into multiple subsets of paired data and measurement qubits. For example, the system may repeat the pairing process described above over multiple subsets, e.g., until each qubit in the system of qubits is paired with at least one other qubit.

In some cases, the multiple subsets of paired data and measurement qubits may include non-overlapping subsets of paired data and measurement qubits. For example, the example two dimensional grid 600 of FIG. 6 illustrates multiple non-overlapping subsets of paired data and respective neighboring measurement qubits. In the example two dimensional grid 600, each subset includes non-adjacent pairs of paired data and respective neighboring measurement qubits. In other cases, the multiple subsets of paired data and measurement qubits may include overlapping subsets of paired data and measurement qubits. For example, the example two-dimensional grid 650 of FIG. 6 illustrates multiple overlapping subsets of paired data and respective neighboring measurement qubits.

The system performs entangling operations on each paired data and measurement qubit in parallel (step 504). For example, the system may apply a two-qubit quantum logic gate, e.g., a controlled-Z quantum logic gate, to each paired data and measurement qubit in parallel. Since variations in the frequency amplitudes of applied entangling operations can occur, performing entangling operations on each paired data and measurement qubit in parallel is understood to mean performing entangling operations on each paired data and measurement qubit in parallel to the extent that the hardware used to perform process 500 allows. Example variations are described in more detail below.

In cases where the system generates multiple subsets of paired data qubits and respective neighboring measurement qubits, as described above with reference to step 504, the system may perform an entangling operation on each paired data and measurement qubit within a respective subset in parallel. To perform entangling operations on each data and measurement qubit in the system of qubits, the system may sequentially perform entangling operations on the paired data and measurement qubits within each subset. In some implementations the order in which the system selects subsets to perform entangling operations on may be arbitrary.

Due to the configuration of the paired qubits, as described above with reference to step 504, each qubit involved in the entangling operations (or each qubit involved in one sequential application of entangling operations on a subset of paired qubits) is either non-adjacent to other qubits involved in the entangling operations, or has the same type on the diagonal. For example, in cases where the data qubits and neighboring measurement qubits have been paired into non-adjacent pairs of data and neighboring measurement qubits, as illustrated in group 602 of FIG. 6, qubits involved in one entangling operation are non-adjacent to qubits involved in other entangling operations. As another example, in cases where the data qubits and neighboring measurement qubits have been paired into overlapping subsets of paired data and measurement qubits with parallel couplers, as illustrated in group 608 of FIG. 6, qubits involved in one entangling operation have the same type on the diagonal, e.g., qubit 610 and 612.

Therefore, when the entangling operations are performed on each paired data and measurement qubit in parallel, each measurement qubit can be detuned without crossing the resonance of another measurement qubit that is performing a similar frequency trajectory on its corresponding data qubit. In fact, since the entangling operations are performed in parallel, the detuning $\Delta\eta$ between the diagonal qubits is constant (or near constant, see below), therefore no occupation transfer from diagonal interactions will arise. In addition, each data qubit can perform part of the trajectory— they do not have to remain at constant frequency. For example, the data qubits may perform a frequency trajectory that moves towards the measurement qubits. The advantages of the method performed by the system remain.

To perform the entangling operation of each paired data and measurement qubit in parallel, the system detunes each measurement qubit in the paired data and measurement qubits in parallel. As described herein, detuning each measurement qubit in the paired data and measurement qubits in parallel may include maintaining constant, or near constant, detuning $\Delta f$ between the measurement qubits in the paired data and measurement qubits. For example, the system may maintain detuning frequencies from a predetermined range of frequencies, e.g., frequencies within a 100 MHz range such as between 500 MHz and 400 MHz or within a 200 MHz range such as between 700 MHz and 500 MHz. In cases where the system pairs multiple data qubits with respective neighboring measurement qubits into multiple non overlapping subsets of paired data and measurement qubits, the system may perform an entangling operation on each paired data and measurement qubit in the subset approximately in parallel for each of the multiple subsets.

In some implementations the system may perform an entangling operation on each paired data and measurement qubit by applying an entangling operation frequency trajectory to the paired data and measurement qubits. An example controlled-Z quantum gate frequency trajectory that may be applied to one or more paired data and respective neighboring measurement qubits is shown with reference to FIG. 7.

In some implementations the system may apply respective entangling operation frequency trajectories to different paired data and measurement qubits. In these implementations, variations between the respective entangling operation frequency trajectories may be maintained below a predetermined threshold. Such variations can occur due to, for example, variations in control pulse amplitudes, e.g., as omitted by the excitation drivelines described herein with reference to FIG. 1.

FIG. 6 shows example pairings of data and measurement qubits for performing entangling operations on a first two dimensional array of qubits 600 and a second two dimensional array of qubits 650. Both two dimensional arrays of qubits 600 and 650 include multiple data qubits, e.g., data qubits 614 and 616, and multiple measurement qubits, e.g., measurement qubit 618 and 620. Each data qubit of the multiple data qubits is coupled to multiple neighboring measurement qubits through respective qubit couplers, as described herein with reference to FIG. 1.

Each paired data and neighboring measurement qubit in the two dimensional array 600 does not overlap with another paired data and neighboring measurement qubit. In addition, each paired data and neighboring measurement qubit has parallel north-south qubit couplers of a same direction—that is each measurement qubit is coupled to a southerly data qubit. For convenience the couplers in each paired data and measurement qubit are shown as north-south couplers, however the couplers could also be south-north (where each measurement qubit is coupled to a northerly data qubit), east-west (where each measurement qubit is coupled to a westerly data qubit) or west-east couplers (where each measurement qubit is coupled to an easterly data qubit).

The first example two dimensional array of qubits 600 includes three non-overlapping subsets. Each subset includes multiple paired data and neighboring measurement qubits. With reference to FIG. 6, a first subset includes all qubits encapsulated by the solid lines, e.g., including qubit pairs 602, 624 and 622. A second subset includes all qubits encapsulated by the thick dashed lines, e.g., including qubit pair 604. A third subset includes all qubits encapsulated by the thin dashed lines, e.g., including qubit pair 606. In some cases, as illustrated in qubit array 600, the pairing of data and neighboring measurement qubits may not be exhaustive. For example, some qubits at the perimeter of the grid may not be paired with other qubits.

Each subset includes non-adjacent pairs of data qubits and neighboring measurement qubits, where a qubit is said to be adjacent to another qubit if it is coupled to the other qubit or is diagonal to the other qubit. That is, pairs in each subset do not neighbor other pairs in the subset. Therefore, when entangling operations are performed approximately in parallel on each pair of data and neighboring measurement qubits within a respective subset, each qubit involved in a respective entangling operation is non-adjacent to other qubits involved in other respective entangling operations. For example, when entangling operations are performed in parallel on the pairs included in the subset represented by solid lines, the measurement qubit in the pair 622 can vary its frequency without crossing the resonance of another measurement qubit that is performing a similar frequency trajectory, since the measurement qubits diagonal to the measurement qubit in the pair 622 are members of the other subsets represented by the thick and the thin dashed lines. As described above, this configuration reduces the probability of parasitic occupation qubit leakage.

Each paired data and measurement qubit in the two dimensional array 650 has parallel qubit couplers of different directions, that is east-west couplers (where each measurement qubit is coupled to a westerly data qubit) or west-east couplers (where each measurement qubit is coupled to an easterly data qubit). In other words, each measurement qubit in the array 650 may either be coupled to a data qubit via an east-west coupler, a data qubit via a west-east coupler, or both. Similarly, each data qubit in the array 650 may either be coupled to a measurement qubit via an east-west coupler, a data qubit via a west-east coupler, or both. For convenience, the couplers in each paired data and measurement qubit are shown as east-west and west-east couplers, however the couplers could also be north-south and south-north couplers.

In some implementations the above described pattern may further be repeated using north-south or south-north couplers, such that all nearest neighbor data qubit and measurement qubit pairs can undergo interactions.

The second example two dimensional array of qubits 650 includes four overlapping subsets. Each subset includes multiple paired data and neighboring measurement qubits. With reference to FIG. 6, a first subset includes all qubits encapsulated by the solid lines, e.g., including qubit pair 654. A second subset includes all qubits encapsulated by the thick dashed lines, e.g., qubit pair 658. A third subset includes all qubits encapsulated by the thin dashed lines, e.g., qubit pair 656. A fourth subset includes all qubits encapsulated by the dotted lines, e.g., qubit pair 652. In some cases, as illustrated in qubit array 650, the pairing of data and measurement qubits may be exhaustive, that is each qubit may be paired with at least one other qubit.

Each subset includes adjacent pairs of data qubits and neighboring measurement qubits. For example, either a data qubit in a respective subset is diagonal to at least one other data qubit in the subset or a measurement qubit in a respective subset is diagonal to at least one other measurement qubit in the subset. Therefore, when entangling operations are performed approximately in parallel on each pair of data and neighboring measurement qubits within a respective subset, each qubit involved in a respective entangling operation is adjacent (diagonal) to other qubits of a same type involved in other respective entangling operations. However, by detuning each measurement qubit in the subset in parallel, e.g., by maintaining approximately constant detuning $\Delta f$ between the measurement qubits in the paired data and measurement qubits, each measurement qubit can be detuned without crossing the resonance of another measurement qubit that is performing a similar frequency trajectory on its corresponding data qubit. As described above, this configuration reduces the probability of parasitic occupation qubit leakage.

Figure 7:
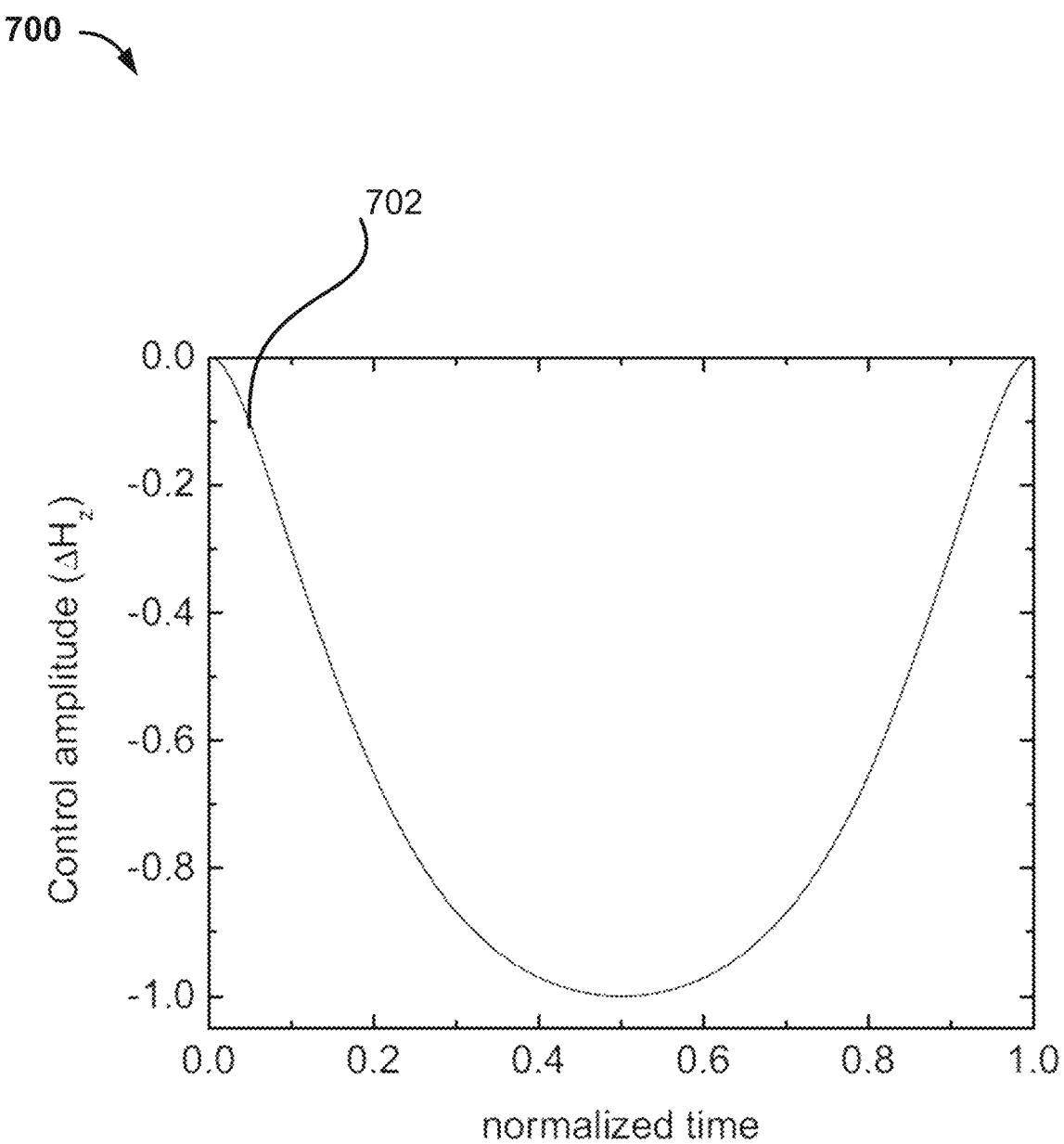
FIG. 7 is an example plot of a controlled-Z quantum gate frequency trajectory.

FIG. 7 is a plot 700 of an example controlled-Z quantum gate frequency trajectory 702. The plot 700 shows an example control frequency amplitude ($\Delta H_z$) versus normalized time during application of an adiabatic controlled-Z quantum gate, as described above with reference to FIG. 5. For example, the control frequency amplitude may represent the amplitude of a control pulse for a controlled-Z quantum gate as generated by excitation pulse generator 110 and emitted by excitation driveline 124 of FIG. 1 above.

The example frequency trajectory 702 may be applied to a paired data qubit and measurement qubit in order to perform an entangling operation, e.g., a controlled-Z quantum gate. As described above with reference to FIG. 5, in some implementations frequency trajectories applied approximately in parallel to respective pairs of data and measurement qubits may include variations in control pulse amplitudes. For example, the values of the control frequency amplitude ($\Delta H_z$) may vary, e.g., by a factor of 100 MHz, to that shown in plot 700.

Figure 8:
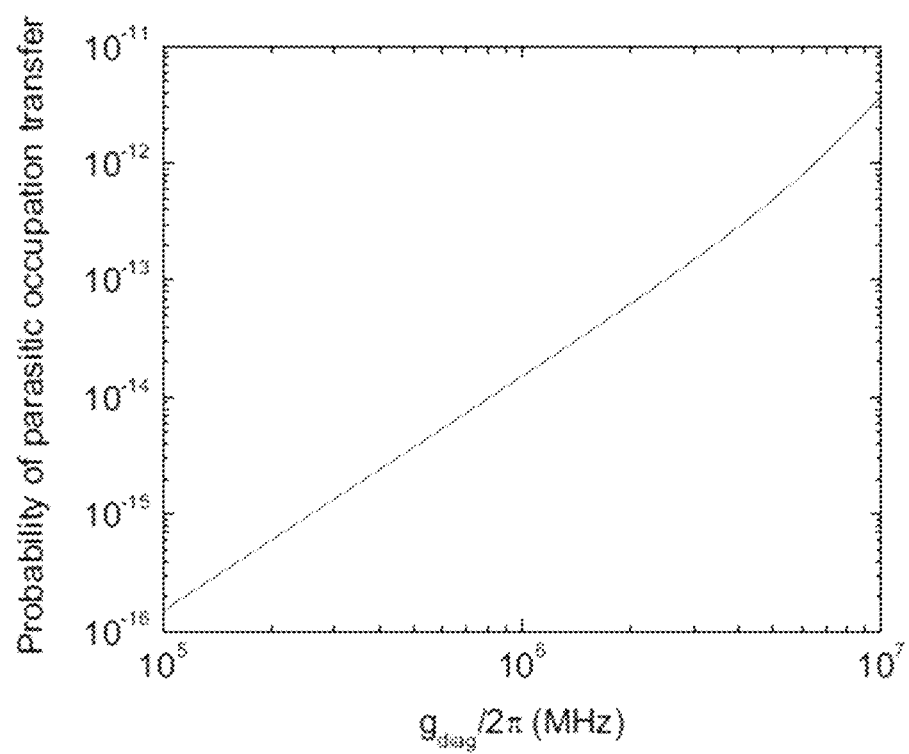
FIG. 8 is an example plot of a probability of parasitic occupation transfer versus diagonal coupling strength.

FIG. 8 is an example plot 800 of the probability of parasitic occupation leakage versus diagonal coupling strength when performing an entangling operation on paired data and measurement qubits in parallel, as described above with reference to FIG. 5.

The probability of parasitic occupation qubit leakage during a standard entangling operation on a paired data and measurement qubit, e.g., an entangling operation different to that described in the present disclosure, can be estimated using the framework of Landau-Zener transitions. The framework of Landau-Zener transitions is described, for example, in "Fast adiabatic qubit gates using only $\sigma_z$ control," J. Martinis and M. Geller, Phys. Rev. A 90, 022307 (2014), the disclosure of which is incorporated herein by reference in its entirety. Within this framework, the probability of occupation leakage can be given by the equation below:

$$P = 2\left(1 - \exp\left(-\frac{\pi H_x^2}{\hbar \dot{H}_z}\right)\right) \approx 2\pi \frac{H_x^2}{\hbar \dot{H}_z}$$

In the above equation, $H_x$ represents qubit coupling strength and $\dot{H}_z = dH_z/dt$ represents a control pulse implementing the standard entangling operation.

Taking $H_x = \hbar\sqrt{2}g_{diag}$, the rate of frequency change during the entangling operation frequency trajectory may be estimated as $\dot{f} = 0.5$ GHz/10 ns, and the rate of change of the control pulse may be estimated as $\dot{H}_z = \hbar \dot{f}$. Inserting these values into the above equation gives P=0.04. This probability of parasitic occupation qubit leakage is a significant detrimental occupation leakage.

The probability P of parasitic occupation leakage during an entangling operation as described by this specification can be estimated as:

$$P = |\theta_{mr}|^2/4$$

$$\theta_{mr} = -\int \frac{d\theta}{d\tau}\exp(-i\omega_x\tau)\,d\tau.$$

In the above equation, $\theta = \arctan(H_x/H_z)$ is a phase associated with a control pulse implementing the entangling operation, $H_x = \hbar\sqrt{2}g$ with g representing the coupling strength between the data qubit and measurement qubit, $H_z$ represents the control pulse, $\theta_{mr}$ represents the error angle in the moving and rotating frame, and $\omega_x = 2H_x/\hbar$.

Using this framework, the probability of parasitic occupation leakage during the entangling operation according to the present disclosure is plotted as a function of parasitic coupling strength in plot 800. In plot 800, the detuning frequency $\Delta f$, as described above with reference to FIG. 5, varies from 500 MHz to 400 MHz, e.g., due to a variation in control pulse amplitudes between the qubits, and $\eta = 200$ MHz. Plot 800 shows that the probability of parasitic occupation leakage remains <$10^{-11}$ for diagonal coupling strengths $g_{diag}/2\pi$ (MHz) between $10^5$ and $10^7$. This provides a stark improvement to the probability in settings where the energy levels of diagonal qubits cross—an improvement of the order of $10^9$.

Programming the Hardware: Surface Code Cycle

In some settings, quantum computers can provide a means to efficiently solve certain problems that may not be efficiently solved using a conventional, classical computer. Example problems include factoring very large numbers into their primes and searching large, unstructured data sets. However, physical systems such as systems of ions, spins in semiconductors, and superconducting circuits may not always perform sufficiently well to serve directly as computational qubits in a quantum computing device.

One approach to building a quantum computing device is based on surface codes. Surface codes provide an error-tolerant method for representing information in the quantum computing device. Logical qubits are constructed from collections of physical qubits in such a way that the logical qubit can perform better than the individual physical qubits.

In some cases surface codes may be operated as stabilizer codes—a method whereby stabilizers are measured in order to detect errors as they arise. By choosing a suitable choice of stabilizer measurements, qubits can be operated to perform logical operations. Measuring stabilizers over a system of qubits therefore constitutes a fundamental repeating cycle for the quantum computer, and all higher functions can be built upon it.

Figure 9:
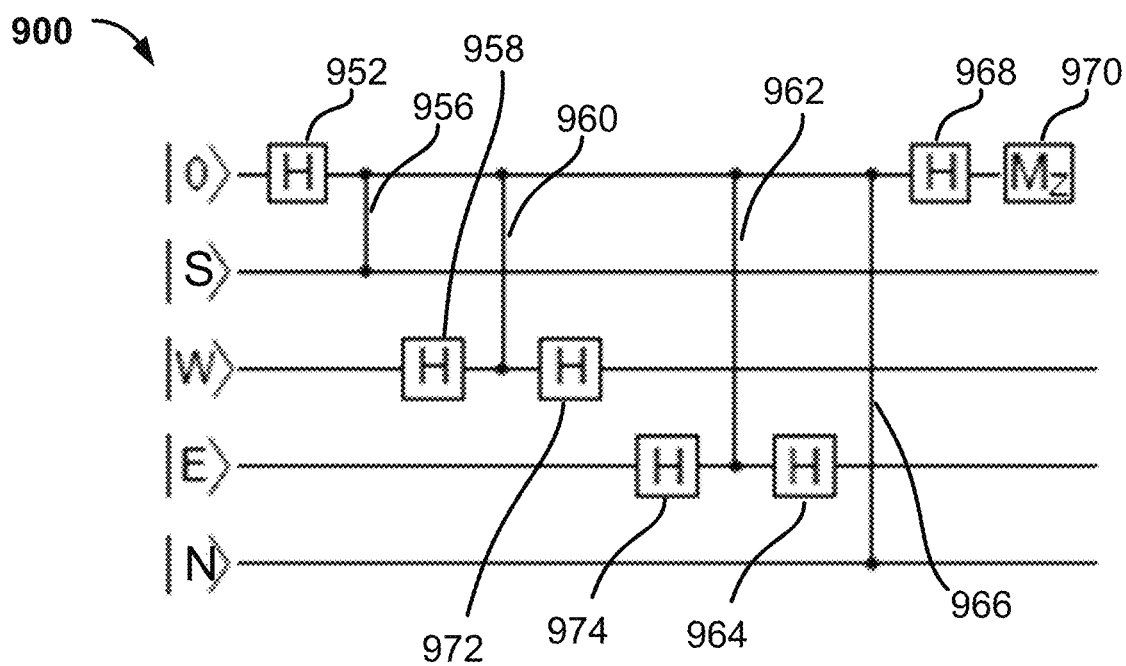
FIG. 9 shows an example quantum circuit to measure a stabilizer for a surface code detection cycle.

FIG. 9 shows an example quantum circuit 900 to measure a stabilizer for a surface code error detection cycle. The example quantum circuit 900 includes a five qubit register. The five qubit register includes a measurement qubit, represented as |0⟩, and four data qubits representing the measurement qubits nearest neighbors. In the example quantum circuit the measurement qubit is assumed to be located in a two-dimensional grid, as described with reference to FIG. 1. The four nearest neighboring data qubits therefore correspond to a southerly data qubit |S⟩, westerly data qubit |W⟩, easterly data qubit |E⟩ and northerly data qubit |N⟩.

In some cases a quantum circuit may have a smaller qubit register, e.g., in cases where the measurement qubit has less neighboring data qubits. For example, if the measurement qubit is at a corner of the two-dimensional grid, the measurement qubit may only have two neighboring data qubits. In this example, a corresponding quantum circuit may have a three qubit register.

Figure 10:
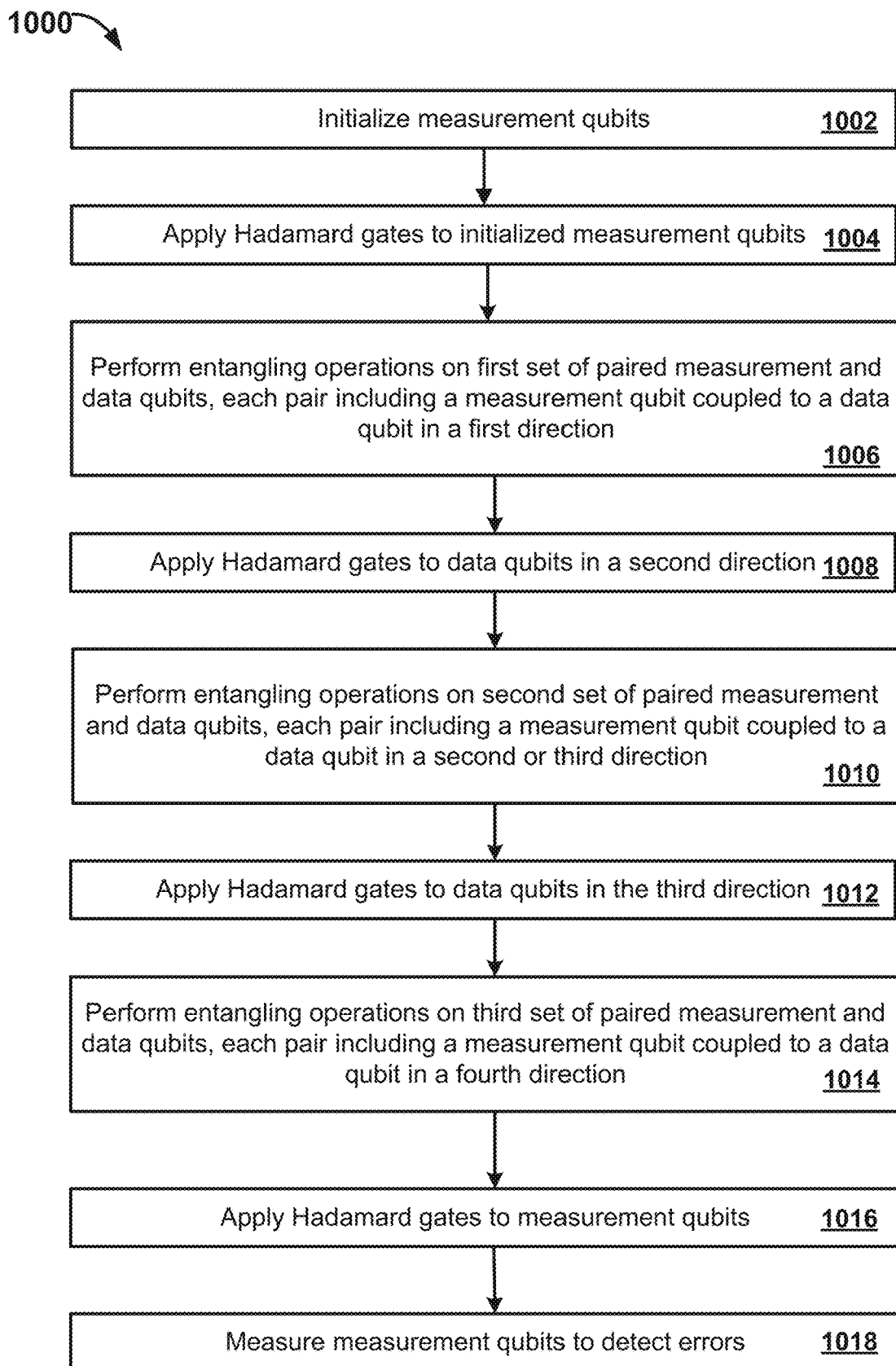
FIG. 10 is a flow diagram of an example process for performing a surface code error detection cycle.

The example quantum circuit 900 shows the sequence of quantum logic gates needed to perform the surface code error detection cycle 1000 described herein with reference to FIG. 10. As described herein with reference to FIG. 10, the example quantum circuit 900 includes a first Hadamard gate 952 that is applied to the measurement qubit |0⟩. Subsequently, a first entangling operation 956 is performed on the measurement qubit register |0⟩ and the southerly data qubit register |S⟩. A second Hadamard gate 958 is subsequently applied to the westerly data qubit register |W⟩. A second entangling operation 960 is then applied to the measurement qubit register |0⟩ and the westerly data qubit register |W⟩.

The example quantum circuit 900 includes a third and fourth Hadamard gate 972 and 974. The Hadamard gates 972 and 974 are sequentially applied to the westerly qubit |W⟩ and easterly qubit |E⟩, respectively. When example quantum circuit 900 is applied to a system of measurement qubits and data qubits, as described above with reference to FIG. 1, a Hadamard gate applied to a westerly data qubit (after an entangling operation between a first measurement qubit and the westerly data qubit) is cancelled by a Hadamard gate applied to an easterly data qubit (before an entangling operation between a second measurement qubit and the easterly data qubit).

A third entangling operation 962 is applied to the measurement qubit register |0⟩ and the easterly data qubit register |E⟩. A fifth Hadamard gate 964 is subsequently applied to the easterly data qubit register |E⟩. A fourth entangling operation 966 is applied to the measurement qubit register |0⟩ and the northerly data qubit register |N⟩. A sixth Hadamard gate is applied to the measurement qubit register |0⟩, followed by a measurement operation 970.

The entangling operations 956, 960, 962, and 966 may include controlled-Z quantum logic gates. When Hadamard quantum logic gates are applied before and after a controlled-Z quantum logic gate, e.g., Hadamard quantum logic gates 958 and 972 or 974 and 964, the three gates together (Hadamard, controlled-Z, Hadamard) operate as a controlled-X quantum logic gate. Therefore, taken collectively, the entangling operations depicted in FIG. 9 may represent an application of the operator ZXXZ (controlled-Z, controlled-X, controlled-X, controlled-Z) if the measurement qubit is in the |1⟩ state.

FIG. 10 is a flow diagram of an example process 1000 for performing a surface code error detection cycle on multiple quantum circuits e.g. quantum circuits shown in FIG. 9. For convenience, the process 1000 will be described as being performed by a system of one or more quantum or classical computers located in one or more locations. For example, the process 1000 can be implemented using the qubit controller 104 of system 100 described above with reference to FIG. 1. In some implementations, the process 1000 may be performed in conjunction with the techniques described above with reference to FIGS. 2 to 8.

The example process 1000 is described as being performed by the system on multiple data qubits and multiple measurement qubits arranged as a two dimensional grid, e.g., grid 112 of FIG. 1, each data qubit of the multiple data qubits being coupled to neighboring measurement qubits through respective qubit couplers, as described above with reference to FIG. 1.

The system initializes the multiple measurement qubits (step 1002). For example, as illustrated in the example quantum circuit 900 of FIG. 9, initializing the multiple measurement qubits may include preparing the measurement qubits in the |0⟩ computational basis state.

The system applies Hadamard quantum logic gates to the initialized measurement qubits (step 1004). By initializing the measurement qubits in the |0⟩ computational basis state and applying Hadamard quantum logic gates to the initialized measurement qubits, the measurement qubits are put it in a 50/50 superposition state of |0⟩ and |1⟩. Application of a Hadamard quantum logic gate 952 to an initialized measurement qubit is illustrated above with reference to FIG. 9.

The system performs multiple entangling operations on a first set of paired measurement and data qubits (step 1006). For example, the entangling operations may include controlled-Z quantum logic gates. Application of a controlled-Z quantum logic gate to a paired measurement and data qubit includes applying a Z operator to the data qubit if the measurement qubit is in the state |1⟩.

Each pair in the first set of paired measurement and data qubits includes a measurement qubit coupled to a neighboring data qubit in a first direction. For example, each pair may include a measurement qubit coupled via a respective qubit coupler to a neighboring data qubit that is below the measurement qubit, e.g., in a southerly direction. Example pairs of measurement qubits coupled to respective neighboring data qubits in a southerly direction are illustrated and described herein with reference to two dimensional qubit grid 600 of FIG. 6. An application of an entangling operation 956 to a measurement qubit paired with a southerly data qubit is illustrated with reference to FIG. 9.

In some implementations, performing multiple entangling operations on the first set of paired measurement and data qubits includes separating the paired measurement and data qubits into multiple subsets of paired qubits, the multiple subsets including non-overlapping and non-adjacent pairs. In these implementations, non-adjacent is understood to include diagonally non-adjacent pairs. Example multiple subsets of paired qubits are illustrated and described above with reference to two dimensional qubit grid 600 of FIG. 6. As illustrated in two dimensional qubit grid 600 of FIG. 6, in some implementations the multiple subsets may include three subsets 602, 604, and 606.

The system may then perform entangling operations on the pairs of qubits in each of the multiple subsets in parallel. For example, as described with reference to FIG. 5, performing entangling operations on pairs of qubits in each of the multiple subsets in parallel may include detuning each measurement qubit in each subset in parallel.

The system applies Hadamard quantum logic gates to the multiple data qubits in the second direction (step 1008). For example, the system may apply Hadamard quantum logic gates to multiple data qubits in a westerly direction from the measurement qubits. Application of a Hadamard quantum logic gate 958 to westerly data qubits is illustrated with reference to FIG. 9.

The system performs multiple operations on a second set of paired measurement and data qubits (step 1010). The operations may include controlled-Z quantum logic gates and Hadamard quantum logic gates. For example, the system may perform controlled-Z quantum logic gates on measurement qubits paired with data qubits in a second direction, followed by performing Hadamard quantum logic gates on the data qubits in the second direction. The system may then perform Hadamard quantum logic gates on the data qubits in a third direction, followed by performing controlled-Z quantum gates on the measurement qubits paired with the data qubits in the third direction.

Each pair in the second set of paired measurement and data qubits includes a measurement qubit coupled to a neighboring data qubit in a second or third direction, the second and third direction being perpendicular to the first direction, and the second direction being opposite to the third direction. For example, each pair may include a measurement qubit coupled via a respective qubit coupler to a neighboring data qubit that is to the right or to the left of the measurement qubit, i.e., in an easterly or westerly direction. Since westerly and easterly entangling operations commute, the system may perform a mix of westerly and easterly entangling operations.

Example pairs of measurement qubits coupled to respective neighboring data qubits in an easterly and westerly direction are illustrated and described above with reference to two dimensional qubit grid 650 of FIG. 6. An application of entangling operations 960 and 962 applied to a measurement qubit paired with a westerly data qubit and an easterly data qubit, respectively, is illustrated with reference to FIG. 9.

In some implementations, performing multiple entangling operations on the second set of paired measurement and data qubits includes separating the paired measurement and data qubits into multiple subsets of paired qubits, the multiple subsets including overlapping and adjacent pairs. In these implementations, adjacent is understood to include diagonally adjacent pairs. Example multiple subsets of such paired qubits are illustrated and described above with reference to two dimensional qubit grid 650 of FIG. 6. As illustrated in two dimensional qubit grid 650 of FIG. 6, in some implementations the multiple subsets may include four subsets 652, 654, 656 and 658.

The system may then perform the operations on pairs of qubits in each of the multiple subsets in parallel. For example, as described with reference to FIG. 5, performing entangling operations on pairs of qubits in each of the multiple subsets in parallel may include detuning each measurement qubit in each subset in parallel.

The system applies Hadamard quantum logic gates to the multiple data qubits in the third direction (step 1012). For example, the system may apply Hadamard quantum logic gates to multiple data qubits in an easterly direction from the measurement qubits. Application of a Hadamard quantum logic gate 964 to easterly data qubits is illustrated with reference to FIG. 9. As described with reference to FIG. 9, when Hadamard quantum logic gates are applied before and after a controlled-Z quantum logic gate, e.g., as described with reference to steps 1010 and 1012, the three gates together act as a controlled-X quantum logic gate.

The system performs multiple entangling operations to a third set of paired measurement and data qubits (step 1014). As described above, the entangling operations may include controlled-Z quantum logic gates. Each pair in the third set of paired measurement and data qubits includes a measurement qubit coupled to a neighboring data qubit in a fourth direction, the fourth direction being opposite to the first direction. For example, each pair may include a measurement qubit coupled via a respective qubit coupler to a neighboring data qubit that is above the measurement qubit, i.e., in a northerly direction. Example pairs of measurement qubits coupled to respective neighboring data qubits in a northerly direction can result from a straightforward modification of the two dimensional qubit grid 600 of FIG. 6. An application of an entangling operation 966 to a measurement qubit paired with a northerly data qubit is illustrated with reference to FIG. 9.

In some implementations, performing multiple entangling operations on the third set of paired measurement and data qubits includes separating the paired measurement and data qubits into multiple subsets of paired qubits, the multiple subsets including non-overlapping and non-adjacent pairs. In these implementations, non-adjacent is understood to include diagonally non-adjacent pairs. In some implementations the multiple subsets may include three subsets.

The system may then perform entangling operations on the pairs of qubits in each of the multiple subsets in parallel. For example, as described with reference to FIG. 5, performing entangling operations on pairs of qubits in each of the multiple subsets in parallel may include detuning each measurement qubit in each subset in parallel.

The system applies Hadamard quantum logic gates to the multiple measurement qubits (step 1016). Application of a Hadamard quantum logic gate 968 to a measurement qubit is illustrated with reference to FIG. 9.

The system measures the multiple measurement qubits to detect errors (step 1018). An example measurement operation 970 is illustrated with reference to FIG. 9.

As described above, performing multiple entangling operations on the first set of paired measurement and data qubits requires three sequential applications of arrays of entangling operations—one application for each subset. If this scheme were applied individually for all four directions of nearest neighbor interaction, e.g., north, south, east and west, the complete surface code error detection cycle 1000 would require 12 applications of entangling operations. However, by detuning geometrically diagonal measurement qubits in parallel, e.g., following the techniques described above with reference to FIGS. 5 and 6, denser patterns of entangling operations enables all interactions perpendicular to the first direction, e.g., east and west, to be completed in just four layers of CZ gate—one application for each subset—resulting in a total of just ten applications of entangling operations.

Optionally, the system may further perform leakage removal. For example, the system may perform leakage removal concurrently with each measurement qubit's final entangling operation, e.g., concurrently with step 1014 described above. For example, the system may swap the measurement and data qubits such that each type of qubit is alternatively reset. This may be achieved by applying a controlled-Z plus swap quantum logic gate that interacts and transfers information in the computational basis states $|0\rangle$ and $|1\rangle$ but does not transfer information in states $|2\rangle$ and higher.

In some implementations a subsequent surface code error detection cycle may be performed in an inverted order to the cycle described in steps 1002—1018 above. For example, instead of performing a south—west/east—north detection cycle, as described above, the system may perform a north—west/east—south detection cycle. That is, the system may initialize the multiple measurement qubits, apply Hadamard quantum logic gates to the initialized measurement qubits, perform entangling operations on the third subset of paired data and measurement qubits in parallel, apply Hadamard quantum logic gates to the multiple data qubits, perform entangling operations on the second subset of paired data and measurement qubits in parallel; apply Hadamard quantum logic gates to the multiple data qubits, perform entangling operations on the first subset of paired data and measurement qubits in parallel, apply Hadamard quantum logic gates to the multiple measurement qubits and measure the multiple measurement qubits to detect errors. Performing the subsequent surface code error detection cycle in this order can ensure that data remains local, e.g., that information read out from each paired measurement qubit corresponds only to a respective data qubit.

Figure 11:
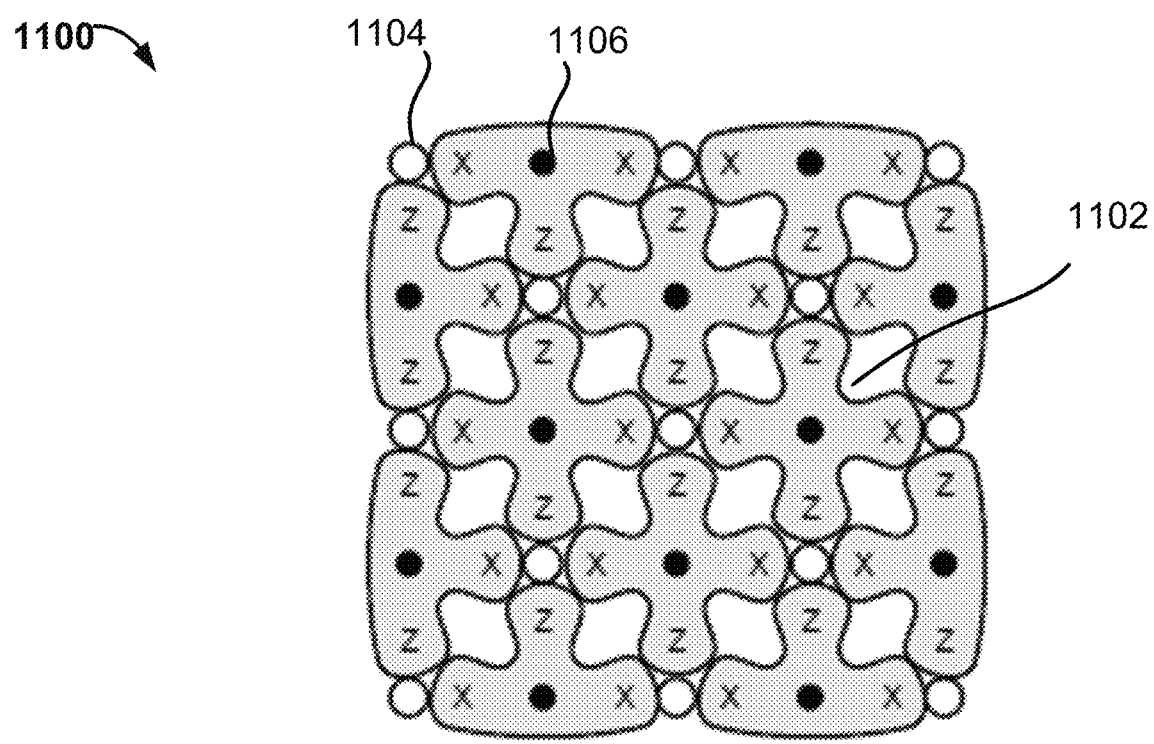
FIG. 11 shows example uniform stabilizers for a surface code detection cycle.

FIG. 11 shows an example implementation of the surface code 1100. The example implementation 1100 shows a two dimensional array of qubits, as described above with reference to FIG. 1. Each of the qubits in the two dimensional array of qubits is represented as an open circle, e.g., qubit 1104, or a filled-in circle, e.g., 1106. In some implementations the open circles represent data qubits, as described above with reference to FIG. 1. In these implementations, the filled-in circles represent measurement qubits, as described above with reference to FIG. 1. For clarity, the two dimensional array of qubits includes 5×5 qubits, however in some cases implementations of the surface code may include a smaller or a larger number of qubits.

As described above with reference to FIG. 1, the qubits interact with each other through multiple nearest neighbor qubit couplers which, for convenience, as not shown in example implementation 1100. Therefore, away from the array boundary, each data qubit contacts four measurement qubits, and each measurement qubit contacts four data qubits. The measurement qubits therefore perform four measurements. On the array boundary, the measurement qubits contact three data qubits and perform three measurements, and the data qubits contact either two or three measurement qubits.

The example implementation 1100 includes multiple uniform stabilizers, e.g., stabilizer 1102. The stabilizers are used to preserve the quantum state of the array of qubits. Generally, by repeatedly measuring a quantum system using a complete set of commuting stabilizers, the quantum system is forced into a simultaneous and unique eigenstate of all the stabilizers. The stabilizers can be measured without perturbing the system. When the measurement outcomes change, this corresponds to one or more qubit errors, and the quantum state is projected by the measurements onto a different stabilizer eigenstate. Surface code stabilizers are described, for example, in "*Surface codes: Towards practical large-scale quantum computation*," A. Fowler et al, Phys. Rev. A 86, 032324 (2012), the disclosure of which is incorporated herein by reference in its entirety.

Each stabilizer in the example implementation 1102 includes a product of $\hat{Z}=\hat{\sigma}_z$ and $\hat{X}=\hat{\sigma}_x$ operators. For example, stabilizer 1102 may be represented as $\hat{Z}_n\hat{X}_w\hat{X}_e\hat{Z}_s$ where the indices n, w, e and s represent the directions north, west, east, and south with respect to the data qubit on which the stabilizer operates on. By combining $\hat{Z}$ and $\hat{X}$ operators in this manner, opposite interactions, e.g., east—west interactions, may be performed simultaneously—where simultaneously is understood to mean simultaneously to the extent that the hardware used to implement the surface code allows—since the east—west operators commute.

Embodiments of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Embodiments of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The invention claimed is:

1. A method for performing a surface code error detection cycle, the method comprising:
    initializing multiple measurement qubits from a system comprising a plurality of data qubits and a plurality of measurement qubits arranged as a two-dimensional grid, wherein each data qubit of the plurality of data qubits within the grid is coupled to neighboring measurement qubits through respective qubit couplers;
    applying Hadamard quantum logic gates to the initialized measurement qubits;
    performing multiple entangling controlled-Z quantum logic gate operations on a first set of paired measurement and data qubits, wherein each pair in the first set of paired measurement and data qubits comprises a measurement qubit coupled to a neighboring data qubit in a first direction;
    performing multiple entangling controlled-X quantum logic gate operations on a second set of paired measurement and data qubits, wherein each pair in the second set of paired measurement and data qubits comprises a measurement qubit coupled to a neighboring data qubit in a second direction;
    performing multiple entangling controlled-X quantum logic gate operations on a third set of paired measurement and data qubits, wherein each pair in the third set of paired measurement and data qubits comprises a measurement qubit coupled to a neighboring data qubit in a third direction, the second and third direction being perpendicular to the first direction, the second direction being opposite to the third direction;
    performing multiple entangling controlled-Z quantum logic gate operations on a fourth set of paired measurement and data qubits, wherein each pair in the fourth set of paired measurement and data qubits comprises a measurement qubit coupled to a neighboring data qubit in a fourth direction, the fourth direction being opposite to the first direction;

applying Hadamard quantum logic gates to the multiple measurement qubits; and measuring the multiple measurement qubits to detect errors.

2. The method of claim 1, wherein performing multiple entangling operations on respective ones of the first, second, third, and fourth sets of paired measurement and data qubits comprises:

separating the pairs into multiple subsets of paired qubits, the multiple subsets comprising non overlapping and non-adjacent pairs.

3. The method of claim 2, wherein the multiple subsets comprise three subsets.

4. The method of claim 2, wherein performing multiple entangling operations comprises performing entangling operations on pairs of qubits in each of the multiple subsets in parallel.

5. The method of claim 4, wherein performing entangling operations on pairs of qubits in each of the multiple subsets in parallel comprises detuning each measurement qubit in each subset in parallel.

6. The method of claim 1, further comprising performing a leakage removal process on the measurement and data qubits.

7. The method of claim 6, wherein performing leakage removal comprises swapping measurement and data qubits.

8. The method of claim 7, wherein swapping measurement and data qubits comprises applying controlled-Z plus swap quantum gates.

9. The method of claim 1, further comprising performing a subsequent surface code error detection cycle, comprising:

initializing the multiple measurement qubits;

applying Hadamard quantum logic gates to the initialized measurement qubits;

performing entangling operations on the third set of paired data and measurement qubits in parallel;

performing entangling operations on the second set of paired data and measurement qubits in parallel;

performing entangling operations on the first set of paired data and measurement qubits in parallel;

applying Hadamard quantum logic gates to the multiple measurement qubits; and measuring the multiple measurement qubits to detect errors.

10. A quantum computing system comprising:

a qubit controller module configured to operate multiple data qubits and multiple measurement qubits, wherein the qubit controller is configured to perform a surface code error detection cycle on the multiple data qubits and multiple measurement qubits, comprising:

initializing multiple measurement qubits from a system comprising a plurality of data qubits and a plurality of measurement qubits arranged as a two-dimensional grid, wherein each data qubit of the plurality of data qubits within the grid is coupled to neighboring measurement qubits through respective qubit couplers;

applying Hadamard quantum logic gates to the initialized measurement qubits;

performing multiple entangling controlled-Z quantum logic gate operations on a first set of paired measurement and data qubits, wherein each pair in the first set of paired measurement and data qubits comprises a measurement qubit coupled to a neighboring data qubit in a first direction;

performing multiple entangling controlled-X quantum logic gate operations on a second set of paired measurement and data qubits, wherein each pair in the second set of paired measurement and data qubits comprises a measurement qubit coupled to a neighboring data qubit in a second direction, performing multiple entangling controlled-X quantum logic gate operations on a third set of paired measurement and data qubits, wherein each pair in the third set of paired measurement and data qubits comprises a measurement qubit coupled to a neighboring data qubit in a third direction, the second and third direction being perpendicular to the first direction, the second direction being opposite to the third direction;

performing multiple controlled-Z quantum logic gate entangling operations on a fourth set of paired measurement and data qubits, wherein each pair in the fourth set of paired measurement and data qubits comprises a measurement qubit coupled to a neighboring data qubit in a fourth direction, the fourth direction being opposite to the first direction;

applying Hadamard quantum logic gates to the multiple measurement qubits; and measuring the multiple measurement qubits to detect errors.

11. The quantum computing system of claim 10, further comprising:

a plurality of data qubits;

a plurality of measurement qubits; and a plurality of qubit couplers defining nearest neighbor interactions between the data qubits and measurement qubits, wherein the multiple data qubits and measurement qubits are arranged as a two dimensional grid, each data qubit of the multiple data qubits is coupled to multiple measurement qubits through respective qubit couplers.

12. The quantum computing system of claim 10, wherein performing multiple entangling operations on respective ones of the first, second, third, and fourth sets of paired measurement and data qubits comprises:

separating the pairs into multiple subsets of paired qubits, the multiple subsets comprising non overlapping and non-adjacent pairs.

13. The quantum computing system of claim 12, wherein the multiple subsets comprise three subsets.

14. The quantum computing system of claim 12, wherein performing multiple entangling operations comprises performing entangling operations on pairs of qubits in each of the multiple subsets in parallel.

15. The quantum computing system of claim 14, wherein performing entangling operations on pairs of qubits in each of the multiple subsets in parallel comprises detuning each measurement qubit in each subset in parallel.

16. The quantum computing system of claim 10, wherein the qubit controller is further configured to perform a subsequent surface code error detection cycle, comprising:

initializing the multiple measurement qubits;

applying Hadamard quantum logic gates to the initialized measurement qubits;

performing entangling operations on the third set of paired data and measurement qubits in parallel;

performing entangling operations on the second set of paired data and measurement qubits in parallel;

performing entangling operations on the first set of paired data and measurement qubits in parallel;

applying Hadamard quantum logic gates to the multiple measurement qubits; and measuring the multiple measurement qubits to detect errors.

17. The quantum computing system of claim 10, wherein the multiple data qubits comprise Xmon qubits and the multiple measurement qubits comprise Xmon qubits.

* * * * *